(12) United States Patent
Rosselli et al.

(10) Patent No.: US 8,325,509 B2
(45) Date of Patent: Dec. 4, 2012

(54) MEMORY DEVICE

(75) Inventors: Silvia Rosselli, Mannheim (DE);
Tzenka Miteva, Stuttgart (DE);
Nikolaus Knorr, Stuttgart (DE);
Gabriele Nelles, Stuttgart (DE); Akio Yasuda, Tokyo (JP)

(73) Assignee: Sony Corporation, Tokyo (JP)

( * ) Notice: Subject to any disclaimer, the term of this patent is extended or adjusted under 35 U.S.C. 154(b) by 267 days.

(21) Appl. No.: 12/672,238

(22) PCT Filed: Aug. 5, 2008

(86) PCT No.: PCT/EP2008/006442
§ 371 (c)(1),
(2), (4) Date: Apr. 7, 2010

(87) PCT Pub. No.: WO2009/019000
PCT Pub. Date: Feb. 12, 2009

(65) Prior Publication Data
US 2011/0286263 A1   Nov. 24, 2011

(30) Foreign Application Priority Data
Aug. 9, 2007 (EP) .................................. 07015711

(51) Int. Cl.
*G11C 11/00* (2006.01)

(52) U.S. Cl. ............... 365/151; 365/146; 365/148
(58) Field of Classification Search ............... 365/151, 365/146, 148
See application file for complete search history.

(56) References Cited

U.S. PATENT DOCUMENTS

| | | | |
|---|---|---|---|
| 5,623,476 A | 4/1997 | Eguchi et al. | |
| 7,539,119 B2* | 5/2009 | Park et al. | 369/126 |
| 2002/0067681 A1* | 6/2002 | Kikukawa et al. | 369/100 |
| 2004/0027849 A1 | 2/2004 | Yang et al. | |
| 2005/0006696 A1* | 1/2005 | Noguchi et al. | 257/316 |
| 2006/0056227 A1* | 3/2006 | Parkinson | 365/148 |
| 2006/0175653 A1 | 8/2006 | Joo et al. | |
| 2007/0007613 A1* | 1/2007 | Wang et al. | 257/467 |
| 2008/0029113 A1* | 2/2008 | Snaidr et al. | 131/334 |

FOREIGN PATENT DOCUMENTS

WO   2006 080478   8/2006

OTHER PUBLICATIONS

U.S. Appl. No. 13/116,690, filed May 26, 2011, Wirtz, et al.

\* cited by examiner

*Primary Examiner* — Huan Hoang
(74) *Attorney, Agent, or Firm* — Oblon, Spivak, McClelland, Maier & Neustadt, L.L.P.

(57) ABSTRACT

Memory device, comprising a storage material, a first electrode connected to the storage material; and a second electrode associated to the storage material.

40 Claims, 11 Drawing Sheets

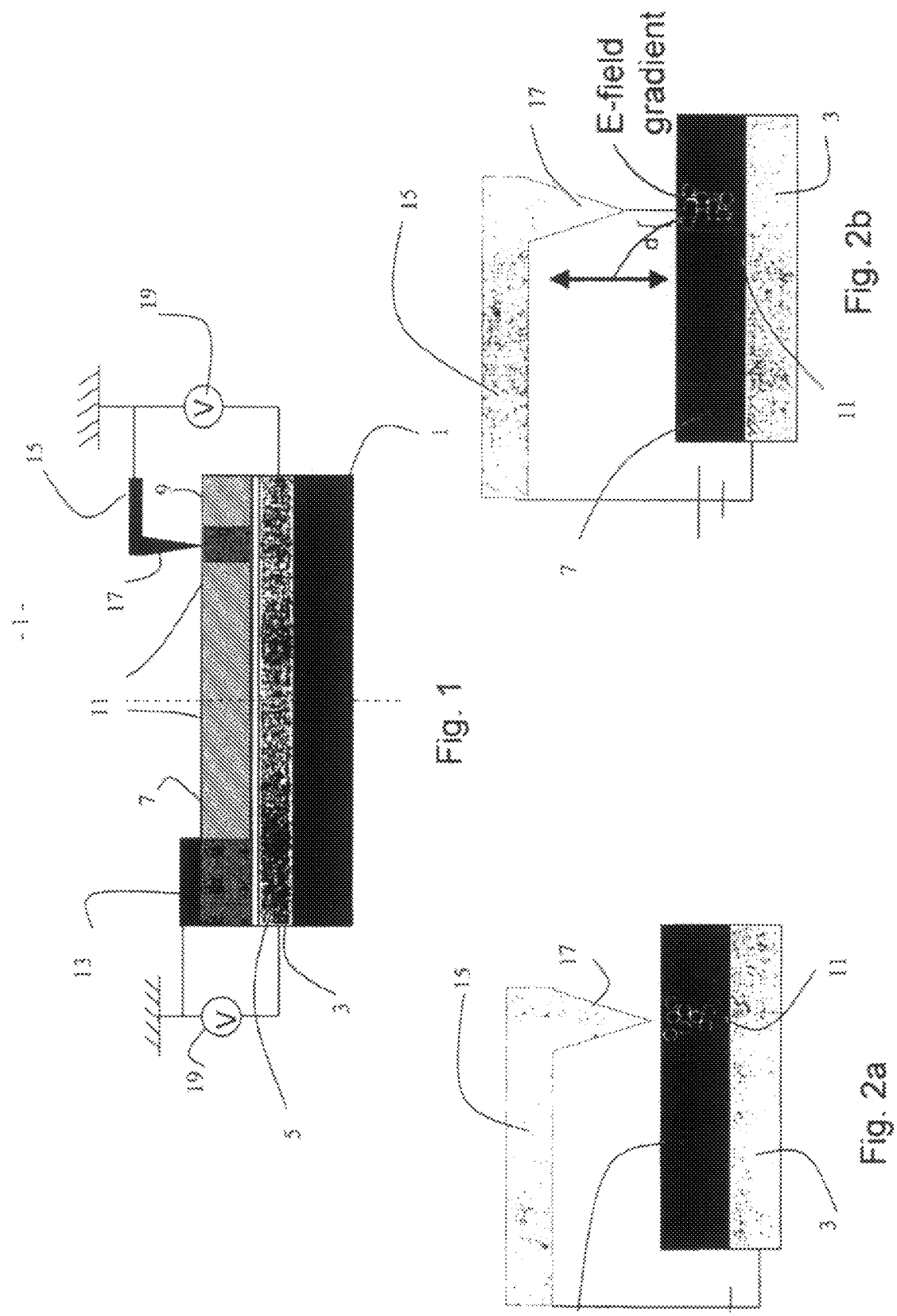

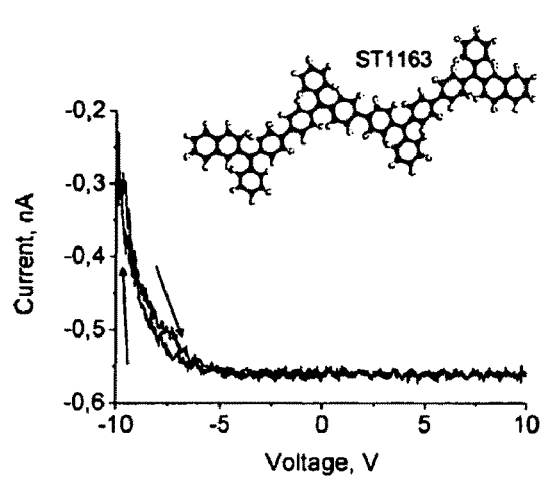
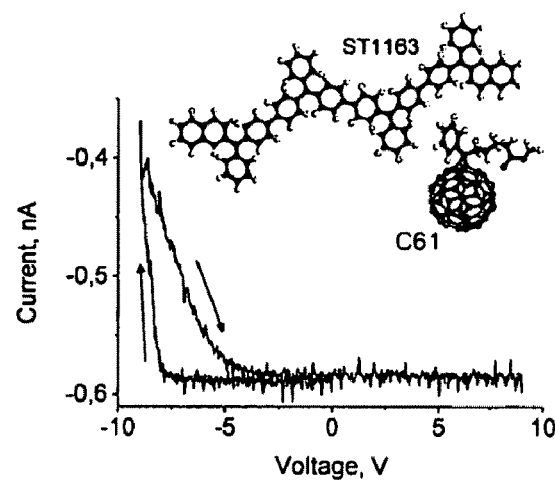
Fig. 13a                Fig. 13b
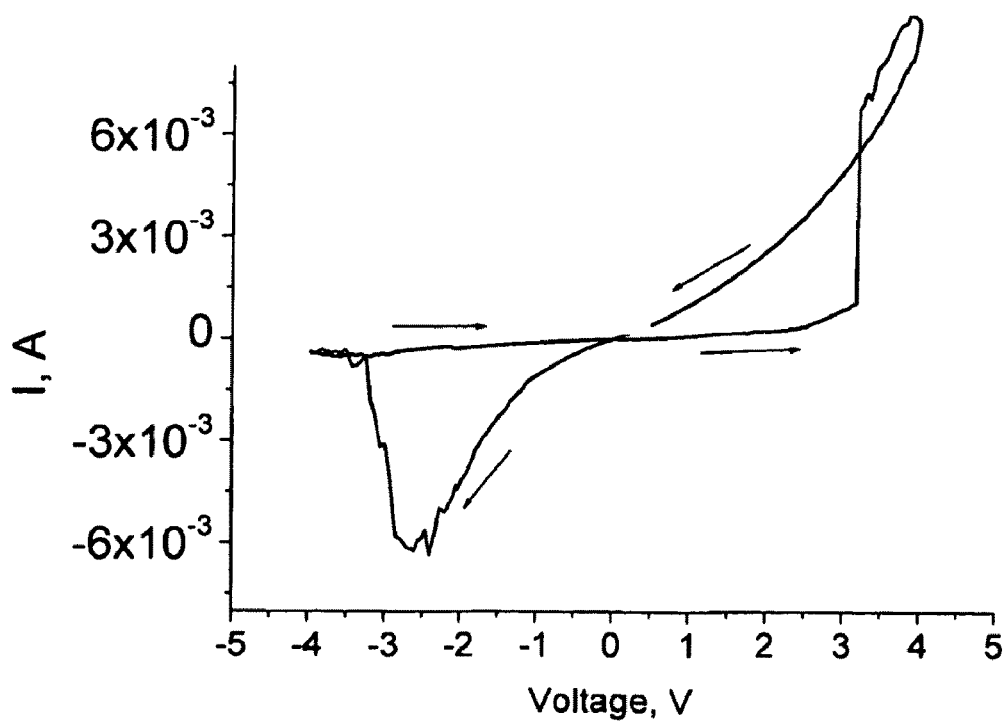
Fig. 14

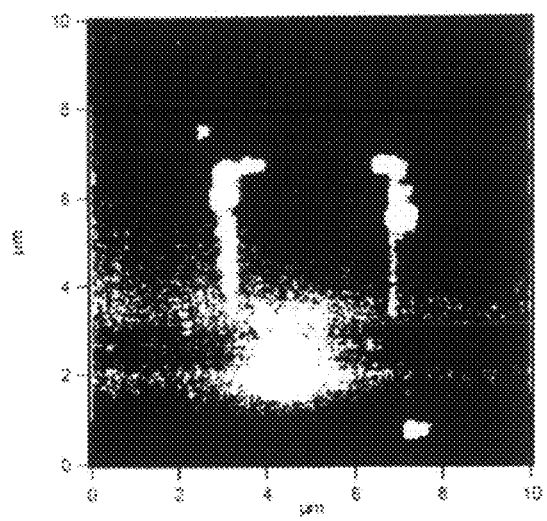 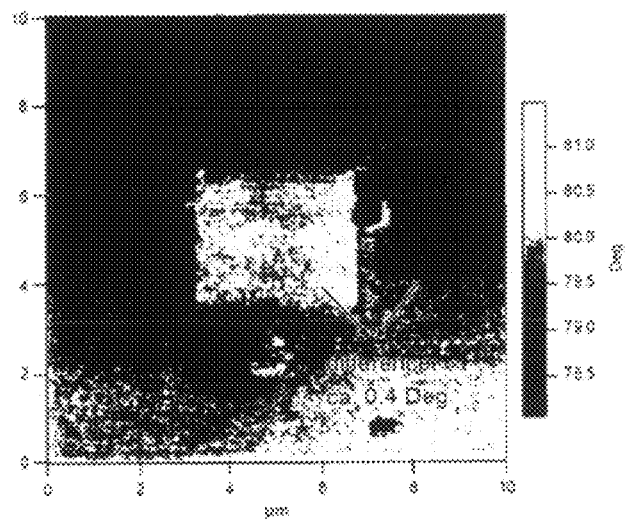
Fig. 22a                    Fig. 22b

MEMORY DEVICE

The present invention relates to re-writable memory devices.

Today diverse architectures of memory devices are known. Among the diverse memory architectures memory devices including a movable probe and memory devices with a cross-bar electrode geometry represent two main alternatives for accessing storage locations.

For memory devices including a movable probe a concept of thermal-mechanical writing has been developed according to which indentations representing stored information by elastically straining a locally softened polymer by applying a force are generated which are subsequently frozen by rapid cooling in order to fix the state. However, these devices are related with problems like long writing times, limited re-writability and limited stability, since storage locations are sensitive to nearby heating of adjacent storage locations.

In other memory devices including a probe a phase-change memory medium is utilized to store data bits in a recording layer. To record a memory state, the recording layer is heated by a current flowing through the tip and is subsequently either slowly cooled to form a crystalline bit or rapidly cooled to form an amorphous bit. In the reading mode, a low level current is used to the sense the high resistance amorphous state or the low resistance crystalline state. Problems such as tip degradation due to a heating in contact mode have been realized for this device type.

In memory devices with a cross-bar electrode structure among others organic charge transfer complexes exhibiting a conductance switching under an application of an electric field have been utilized as a recording medium sandwiched between the electrodes.

Two general types of recording media used in memory devices are polymer and molecular storage materials. A polymer memory element is a thin-film, organic/metal/organic, triple-layer structure between two metal electrodes. One example of an organic material is 2-amino-4,5-imidazoledicarbonitrile as described by Ma et al. in "Organic electrical bistable devices and rewritable memory cells", APL 2002 (80) p. 2997.

A polymer memory utilizes the effect of electrical bistability in the triple-layer structure. The triple-layer structure exhibits two states of different conductivities at the same applied voltage. The WRITE operation is performed by applying a voltage pulse to the structure, which results in reversible switching between a low-resistance and a high-resistance state. After the transition occurs, the device remains in one of two states after turning off the power. The ERASE operation is performed by application of a reverse voltage pulse. A switching time of 10 ns was reported.

A molecular memory is a broad term encompassing different proposals for using individual molecules as building blocks of memory cells in which one bit of information can be stored in the space of an atom or a molecule. One experimentally demonstrated approach is based on rapid reversible change of effective conductance of a molecule attached between two electrodes controlled by an applied voltage. In this molecular memory data are stored by applying an external voltage that causes the transition of the molecule into one of two possible conduction states. Data is read by measuring resistance changes in the molecular cell.

Generally, organic or hybrid materials can also change their polarization after application of a current or electric field depending on the material and the mechanism and generate the two states ON and OFF.

Thus with respect to conductivity and polarization changes, generally, four different groups of storage materials can be defined such as (a) current driven conductivity change materials, (b) electric field driven conductivity change materials, (c) current driven polarization change materials, and (d) electric field driven polarization change materials.

Current driven conductivity changes may result from diverse effects like metal nanofilament formation, redox reactions, mobile ions, trap-, space-, and interface-charge depletion or accumulation. Materials studied in the literature are semiconducting polymers (e.g. APL (89) Jabbour et al. 013507 (2006)) or small molecules (e.g. APL (87) Ma et al. 023505 (2005)).

Patents relevant to these materials are U.S. Pat. No. 5,623,476, U.S. Pat. No. 6,903,958, U.S. Pat. No. 7,035,140, U.S. Pat. No. 7,061,791.

To this category also belong electron poor molecules, i.e. aromatic molecules with electron withdrawing groups, and redox addressable molecules. In redox addressable molecules the injection of electrons chemically reduces the molecule and the increased amount of electrons in the $\pi^*$ orbitals increases the conductivity of the material, that transfers from a low conduction state (OFF) to a high conduction state (ON).

Regarding electron poor molecules a switching device in a cross bar architecture based on Rose Bengal with an ON-OFF ratio of $10^6$ was reported (A. J. Pal et al., J. Phys. Chem. B 107, 2003, pp. 2531).

Regarding redox addressable molecules a device in a cross bar architecture with an ON-OFF ratio of 0.25 has been described by Y. K. Kim et al., Thin Solid Films, 438-439, 2003, pp. 127.

Regarding electric field driven conductivity change materials two different groups are principally known.

In a first group a charge transfer between components of the active layer upon application of an electric field results in a conductivity change.

Examples of materials studied in the literature are organic or polymer layers including electron acceptor and electron-donor molecules (e.g. Yang et al. Adv. Mater. 2005 (17) pp. 1440), metal nanoparticles distributed in polymer films used as donors and molecules as acceptors (e.g. in Yang et al. Nature Materials Vo. 3, December 2004, pp. 918). A charge transfer may also result between an ultrathin metal film and an organic material, wherein the metal film is sandwiched between layers of the organic molecular material as described in U.S. Pat. No. 7,170,779. Furthermore, also organic charge transfer complexes can be used as the active layer (Adachi et al., APL (83) No. 6 (2003) pp. 1252).

In a second group a charge transfer occurs from the electrode to molecules in an oriented active layer (Majumdar et al. Synthetic Metals 140 (2004) p. 203-206).

Current driven polarization change materials include a polarization information storage in spin cast thin film polymer electrets by charge storage with bit read/write/erase function by conducting surface probe technique (in differentiation to information storage in hardwired electret devices like EEPROMs and Flash memory and inorganic material probe devices). The bits are written and erased by voltage pulse application with the conducting probe in contact to the sample, and read-out by a surface probe electric field sensitive method like electric force microscopy (EFM), Kelvin probe force microscopy (KPFM), Scanning resistive probe microscopy (SRPM), scanning capacitance microscopy (SCM) or scanned probe microscopy with the probe being i.e. a field-effect transistor (U.S. Pat. No. 5,132,934).

First surface probe charge storage results in thin film polymer electrets have been described in 1988 Stern at al. (APL 1988 (53) pp. 2717) with ~1 µm charge spots in a PMMA film detected by EFM with an etched nickel tip. In 2001, Stemmer et al. wrote charge signals with a resolution of ~100 nm using KPFM in PTFE-like fluorocarbon layers on silicon produced by plasma enhanced chemical vapor deposition from hexafluoropropene precursor gas (Adv. Mater. 2001 (13), No. 18, pp. 1395). In 2005, Jacobs et al. wrote charge patterns on thin PMMA films by nanocontact printing and detected them by KPFM with resolutions down to 60 nm (Nanoletters, 2005 Vol. 5, No. 10, p. 2078-2084).

In the group of electric field driven polarization change materials organic ferroelectric thin films have been proposed as storage materials (US2005/0094430, U.S. Pat. No. 6,812,509).

The known memory devices and materials show several disadvantages such as a low retention times and a low grade of re-writeability.

Accordingly, it is the object of the present invention to provide an improved memory device which overcomes the disadvantages of devices of prior art and which, in particular, has an improved retention time and a high degree of re-writeability.

This problem is solved by a memory device according to claim 1, by a method of storing information according to claim 23 and by a method of manufacture according to claim 28.

Advantageous embodiments of the present invention are defined in the dependent claims.

According to the present invention, a memory device is provided which comprises a storage material, a first electrode connected to the storage material, and a second electrode associated to the storage material. The memory device according to the present invention has an improved retention time and a high degree of re-writeability. Furthermore, the memory device according to the present invention includes a high density of memory locations in a storage material each having two well-distinguishable memory states which define a high degree of bistability. The electrode can be of metal such as, Au, Pt, Al, Ag, etc, semiconductor such as Si, Ge, ITO, FTO etc or a conductive polymer such as doped PANI, PEDOT, PT etc. without being restricted thereto.

According to one embodiment the storage material is supported on a substrate. The storage material can be deposited on the substrate by deposition techniques such as CVD, PECVD, MOCVD, sputtering, ablation, spin coating, evaporation, self assembly, electrostatic layer-bylayer self-assembly, Langmuir Blodgett technique, Langmuir-Schäfer technique without being restricted thereto. The substrate can be of glass, plastic such as PET, PEN, PC etc and semiconductor such as Si, Ge, etc without being restricted thereto. The storage material can be applied to the substrate as a continuous layer or as a discontinuous layer including separate areas or fields of storage material corresponding to at least one storage location.

According to a further embodiment an interface layer is provided between the first electrode and the storage material. According to another embodiment an interface layer is provided alternatively or additionally on the storage material. The interface layer has the function to improve charge injection, adjust if necessary the work function, limit surface roughness and limit diffusion in the active layer. The interface layer can comprise PEDOT-PSS, PANI, silane, ammines, LiF, 4-chlorobenzoylchloride (CBC), 4-chlorobenzenesulfonyl chloride (CBS), 4-chlorophenyldichlorophosphate (CBP) etc. without being restricted thereto.

According to a preferred embodiment, the memory device comprises a probe that is movable across the storage material and that forms the second electrode. Preferably, the probe comprises a cantilever having a fine tip which permits a high density of adjacent memory locations in the storage material and a high scanning resolution of the tip. The probe can be brought into contact with the storage material to write information into, or read and erase information at a storage location. Alternatively, reading a storage location can be performed with the tip arranged at a distance above the surface of the storage material. Bringing the probe in close proximity to the surface without contacting the surface has the advantage that no damage or abrasion of the storage material or of the tip is risked.

According to another preferred embodiment, the second electrode is fixed to the storage material. A corresponding memory device may comprise a bottom electrode and a top electrode arranged in a cross-bar structure, wherein a continuous layer of storage material or separate regions of storage material are provided between strips of electrode material. Preferably, an array of storage locations is build by providing several parallel strips of electrode material having a storage material sandwiched between them in a crossing arrangement, wherein storage locations are defined at the crossing points of the strips. Of course, other hard-wired geometric arrangements are also possible.

According to another preferred embodiment, the memory device comprises means adjusted to apply a voltage pulse to a portion of the storage material to store and erase information in the storage material. In the case of a memory device including a probe, the probe is preferably arranged in contact to the surface of the storage material at a storage location during the writing and erasing operations.

According to one embodiment, the storage device comprises a means to read information stored in the storage material. The means is adapted to apply and measure an electric current flowing through the storage material at a storage location and the electrodes (or the probe and tip) or adapted to measure an electric field in the storage material at a storage location. For the measurement of an electric field of the storage material at a storage location a probe can be located in close proximity to the storage material without bringing it into contact with the storage material.

According to a preferred embodiment, the storage material is one of the group comprising a material exhibiting a change of conductivity upon application of an electrical current, a material exhibiting a change of conductivity upon application of an electric field, a material exhibiting a change of polarization upon application of an electric current and a material exhibiting a change of polarization upon application of an electric field.

The storage material can be prepared by spin-coating, evaporation, layer by layer deposition, electrostatic self-assembly and Langmuir Blodgett technique etc.

According to another embodiment the storage material that exhibits a change of conductivity upon application of an electric current is an electron poor molecule. Generally, electron poor molecules are molecules with electron withdrawing groups (with positive Hammett, $\delta$, constant) and any electron donor groups and transition metal complexes with ligands having electron withdrawing groups directly attached to the metal. They can be single molecules, oligomers or polymers.

According to one embodiment the electron poor molecules are defined by one of the formulas without being restricted thereto:

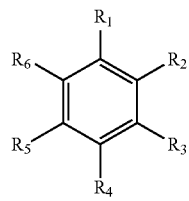

wherein R, $R_1$, $R_2$, $R_3$, $R_4$, $R_5$, $R_6$=C=O, COOH, F, Cl, Br, I, CN, $NO_2$, $NR_3^+$, O—Ar, COOR, OR, COR, SH, SR, $CONH_2$, CONHR, $CONR_2$, CHO, OH, $SO_2R$, $SO_2OR$, NO, C≡CR, Ar; and

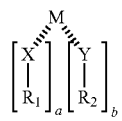

wherein M=transition metal, X, Y=electron withdrawing group like C=O, COOH, F, Cl, Br, I, CN, $NO_2$, $NR_3^+$, N=C, O—Ar, COOR, OR, COR, SH, SR, $CONH_2$, CONHR, $CONR_2$, CHO, C=N, OH, $SO_2R$, $SO_2OR$, NO, C≡CR, Ar and $R_1$, $R_2$=aromatic, allilylic; a, b=integer number.

According to one embodiment the electron poor molecule comprises one of the following formulas without being restricted thereto:

According to a further embodiment the storage material that exhibits a change of conductivity upon application of an electric current comprises a Redox-addressable molecule. Generally, redox addressable molecules are molecules in which the conjugation length and with it the conductivity changes upon chemical reduction or oxidation. They can be single molecules, oligomers or polymers. A typical redox addressable group are the 4,4' bipyridinium salts.

According to one embodiment the Redox-addressable molecules are defined by the formula without being restricted thereto:

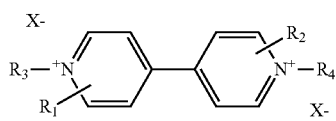

wherein $R_1$, $R_2$, $R_3$, $R_4$=aryl or alkyl $X^-$=anion.

According to a preferred embodiment the Redox-addressable molecule comprises one of the formulas without being restricted thereto:

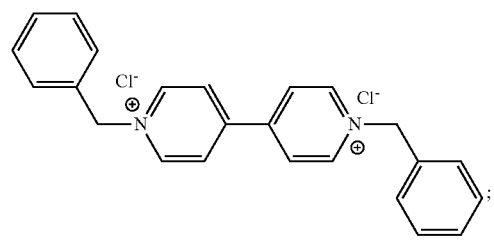

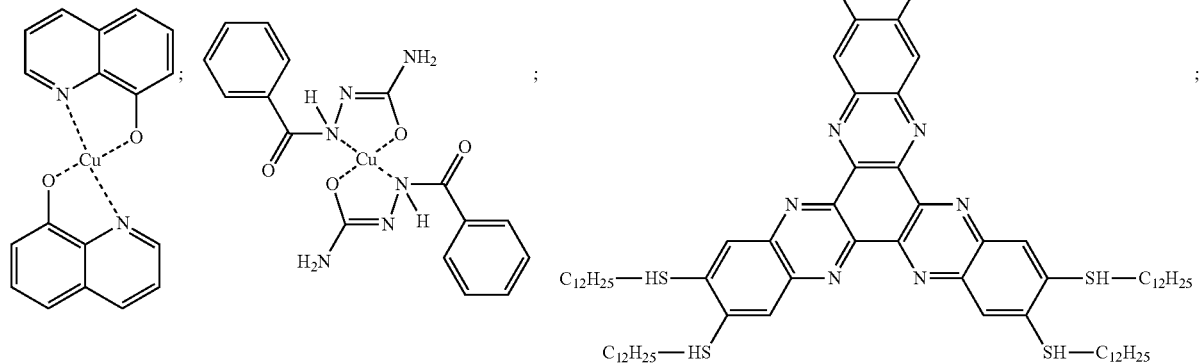

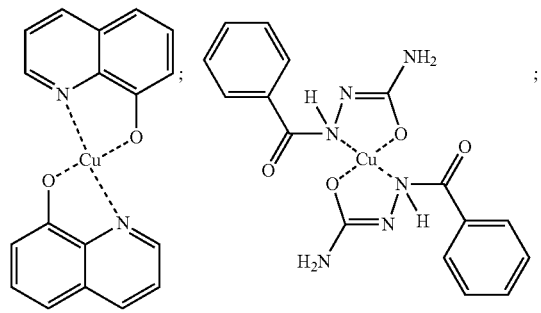

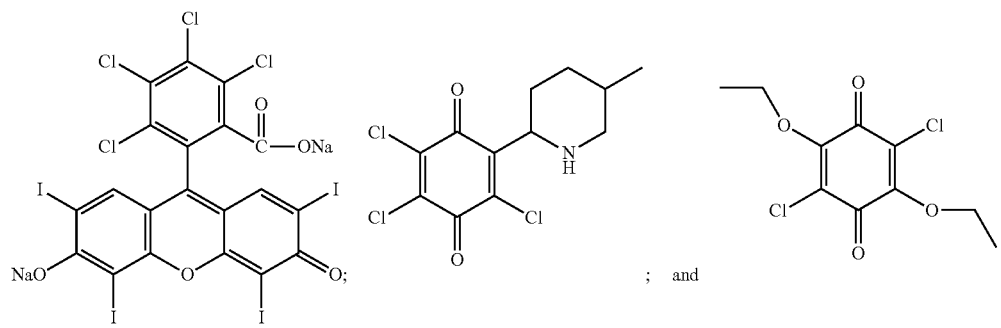

; and

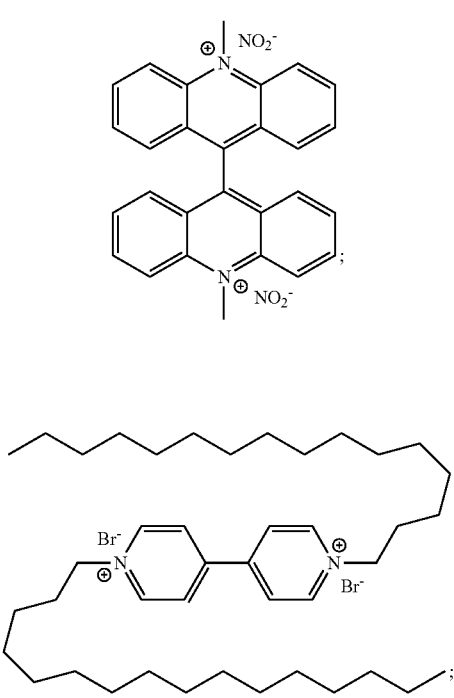

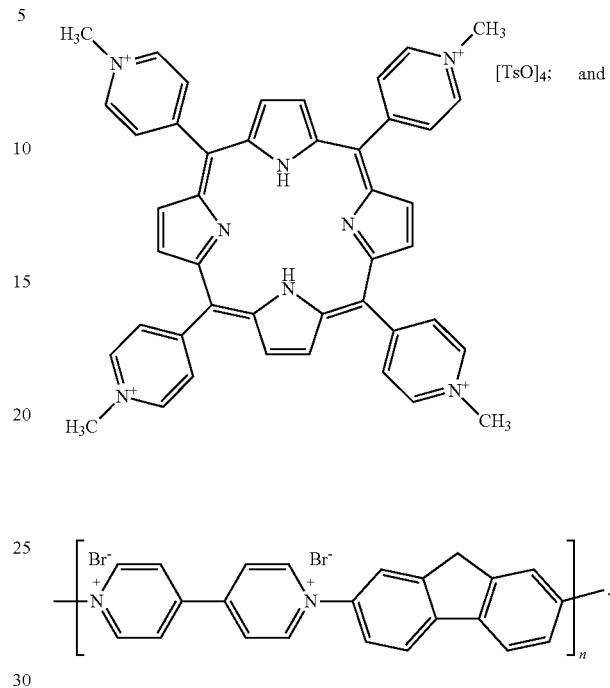

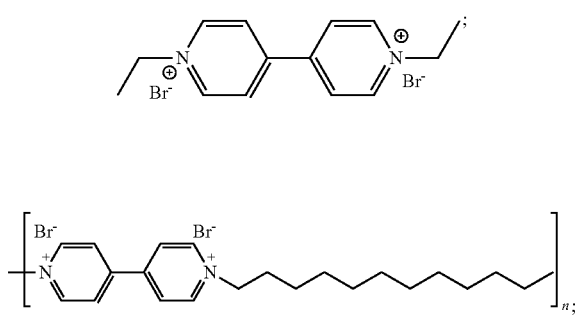

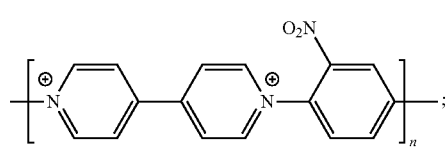

According to yet another embodiment the storage material includes components undergoing a charge transfer in response to an application of an electric field or the storage material undergoes a charge transfer with a connected electrode in response to an application of an electric field. Generally, these materials referred to as charge-transfer complexes are electron-donorelectron-acceptor complexes that are characterized by at least one electronic transition to an excited state in which there is a partial transfer of an electronic charge from the donor to the acceptor moiety.

Donor and acceptor molecules in the charge transfer complex are so defined that the highest occupied molecule orbital (HOMO) of the donor and the lowest unoccupied molecule orbital (LUMO) of the acceptor are close enough with each other that upon application of an electric field an electron of the HOMO of the donor can transfer to the LUMO of the acceptor and vice versa depending from the electric field direction.

Donor molecules are molecules that donate electrons during the formation of the charge transfer complex.

According to one embodiment the donor molecules contain one or more of the following donor groups without being restricted thereto: $O^-$, $S^-$, $NR_2$, $NAr_2$, NRH, $NH_2$, NHCOR, OR, OH, OCOR, SR, SH, Br, I, Cl, F, R, Ar.

They can be single molecules, oligomers or polymers.

According to one embodiment the storage material comprises a donor molecule of one of the following formulas without being restricted thereto:

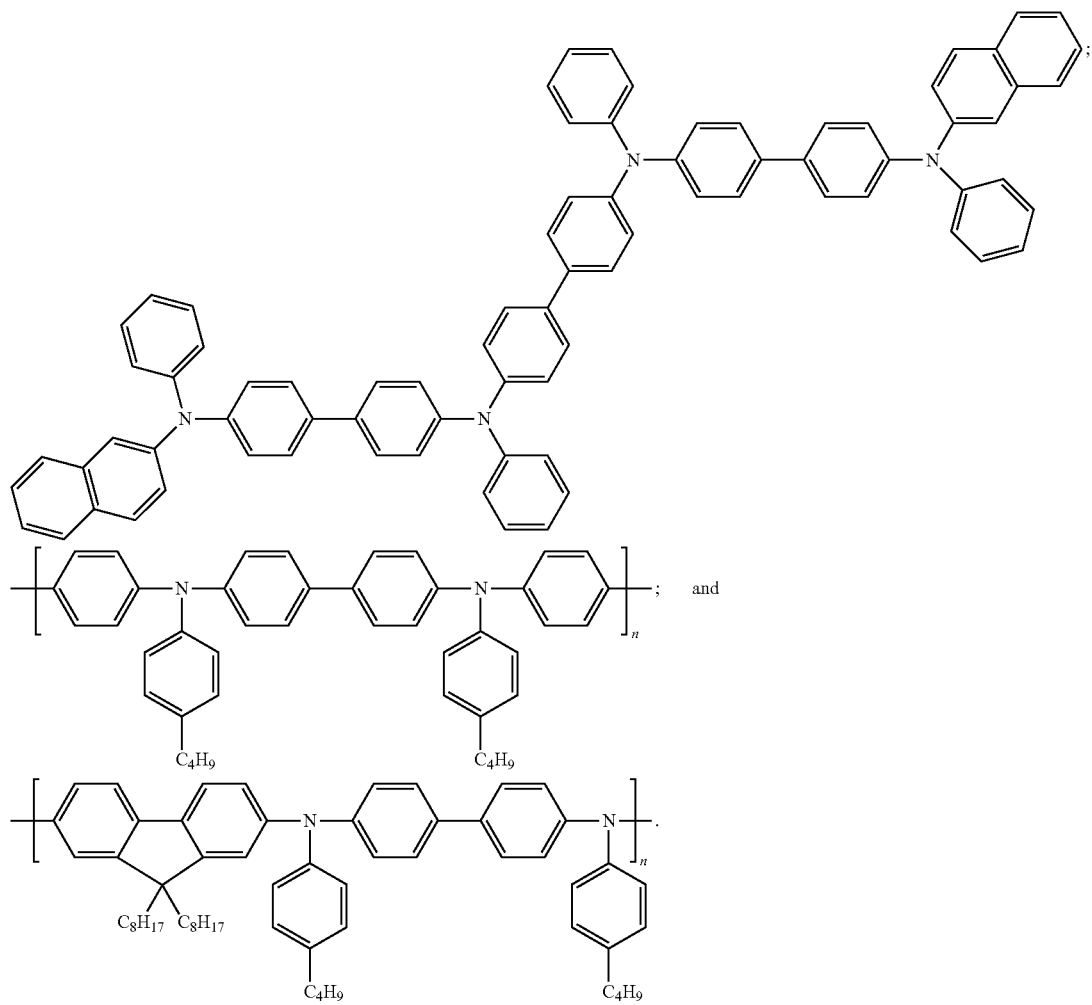

Acceptor molecules are molecules that accept electrons during the formation of a charge transfer complex.

According to one embodiment acceptor molecules contain one or more of the following acceptor groups without being restricted thereto: $NO_2$, CN, COOH, COOR, $CONH_2$, CONHR, $CONR_2$, CHO, COR, $SO_2R$, $SO_2OR$, NO, Ar.

They can be single molecules, oligomers or polymers.

Acceptor molecules are found also among the fullerene derivatives, semiconductor nanodots and electron poor transition metal complexes.

According to another embodiment the storage material comprises an acceptor molecule of the group comprising C60 fullerene, C61 fullerene, CdSe, and platinum octaethyl porphine.

According to another embodiment the storage material undergoing a charge transfer in response to an application of an electric field is a material having conjugated main-chain as well as side-chain liquid crystalline polymers which can be aligned in mono-domain or multidomain structures.

According to one embodiment the material has the following formula without being restricted thereto:

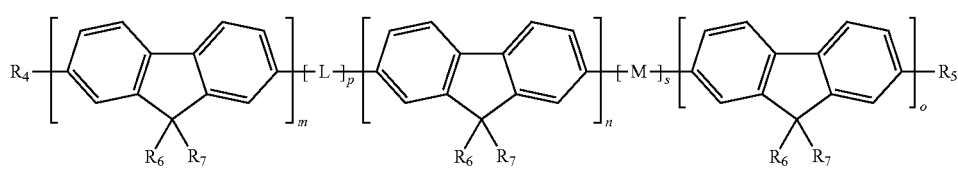

wherein R4 and R5 are independently at each occurrence selected from the group comprising:

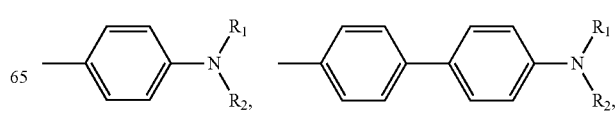

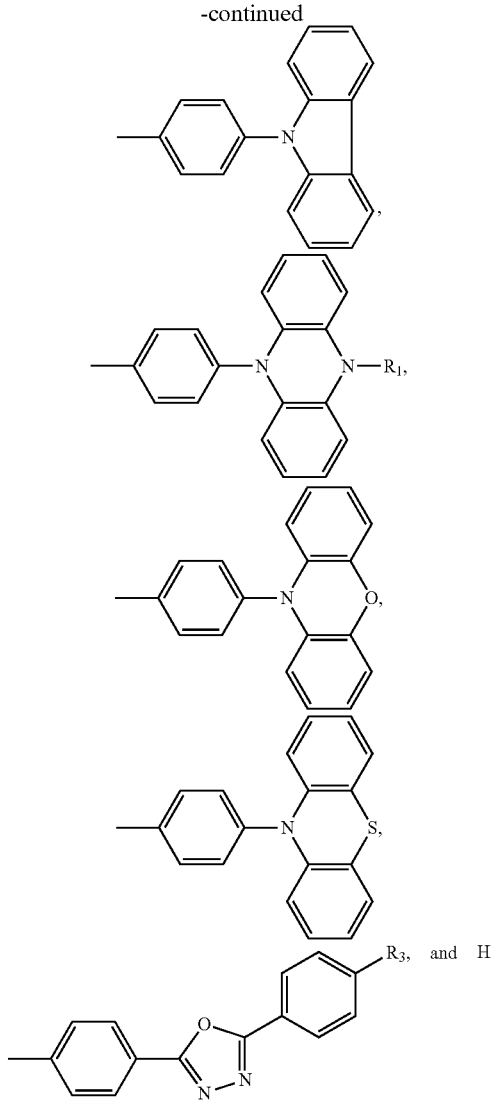

R1 and R2 being independently selected from the group comprising straight chain $C_{1-20}$ alkyl, branched $C_{1-20}$ alkyl, aryl, substituted aryl, alkylaryl, substituted alkylaryl, alkoxyaryl, substituted alkoxyaryl, aryloxyaryl, substituted aryloxyaryl, dialkylaminoaryl, substituted dialkylaminoaryl, diarylaminoaryl and substituted diarylaminoaryl, R3 being selected from the group comprising straight chain $C_{1-20}$ alkyl, branched $C_{1-20}$ alkyl, aryl, substituted aryl, alkylaryl and substituted alkylaryl, and wherein R6 and R7 are independently at each occurrence selected from the group comprising straight chain $C_{1-20}$ alkyl, branched chain $C_{1-20}$ alkyl, aryl, substituted aryl, alkylaryl, substituted alkylaryl, —$(CH_2)_q$—(O—$CH_2$—$CH_2)_r$—O—$CH_3$, q being selected from the range $1<=q<=10$, r being selected from the range $0<=r<=20$, and wherein L and M are independently at each occurrence selected from the group comprising thiophene, substituted thiophene, phenyl, substituted phenyl, phenanthrene, substituted phenanthrene, anthracene, substituted anthracene, any aromatic monomer that can be synthesized as a dibromo-substituted monomer, benzothiadiazole, substituted benzothiadiazole, perylene and substituted perylene, and wherein m+n+o<=10, each of m, n, o being independently selected from the range 1-1,000,
and wherein p is selected from the range 0-15,
and wherein s is selected from the range 0-15,
with the proviso that, if R4 is H, R5 is not H, and if R5 is H, R4 is not H.

According to another embodiment the material has the following formula without being restricted thereto:

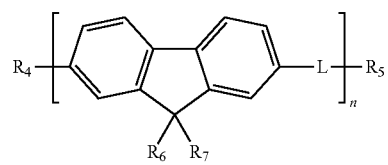

wherein L independently at each occurrence is selected from the group consisting of thiophene, substituted thiophene, phenyl, substituted phenyl, phenanthrene, substituted phenanthrene, anthracene, substituted anthracene, any aromatic monomer that can be synthesized as a dibromo-substituted monomer, benzothiadiazole, substituted benzothiadiazole, perylene and substituted perylene, and wherein $R_6$ and $R_7$ are independently at each occurrence selected from the group consisting of straight chain $C_{1-20}$, branched chain $C_{1-20}$ alkyl, aryl, substituted aryl alkylaryl, —$(CH_2)_q$—(O—$CH_2$ $CH_2)_r$—O—$CH_3$, q being selected from the range 1-10, r being selected from the range 0-20 and wherein R4 and R5 are independently at each occurrence selected from the group comprising:

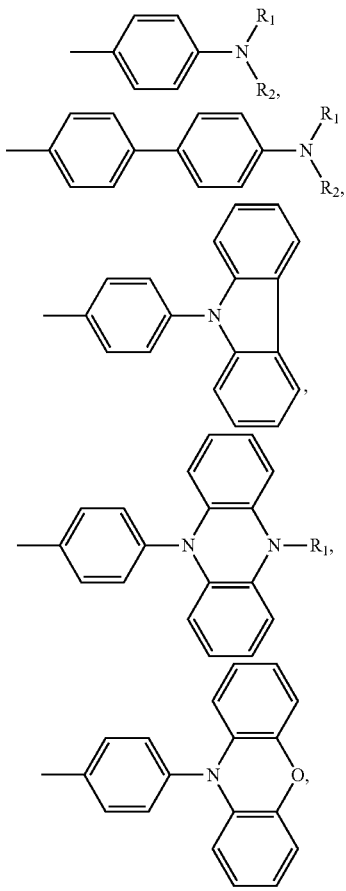

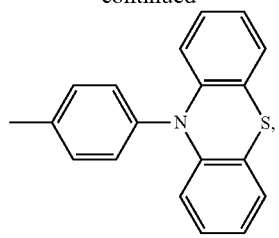
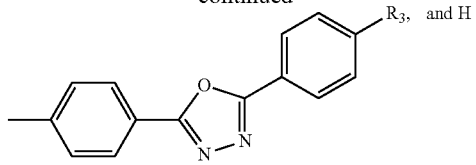
According to yet another embodiment the material has one of the following formulas without being restricted thereto:
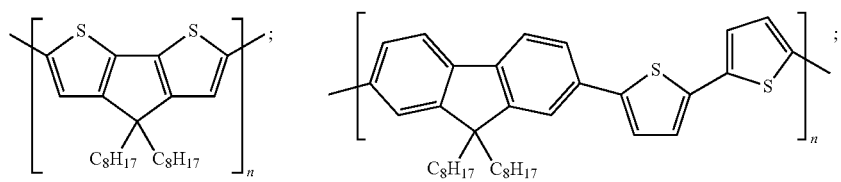
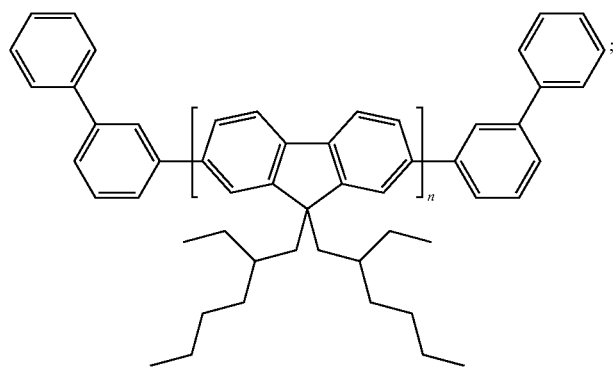
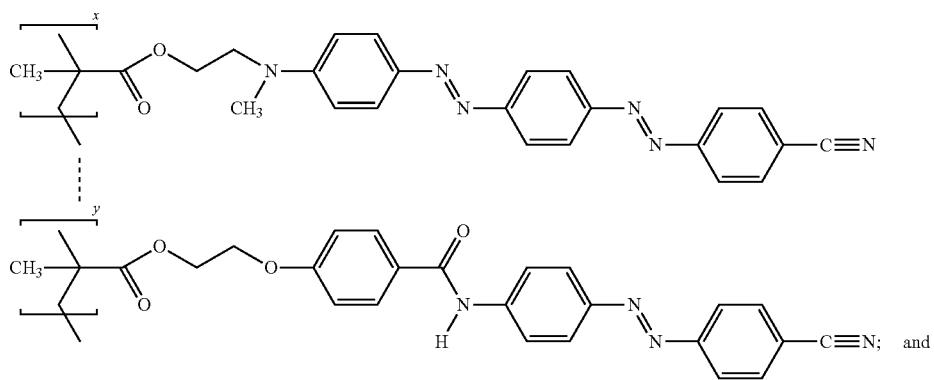

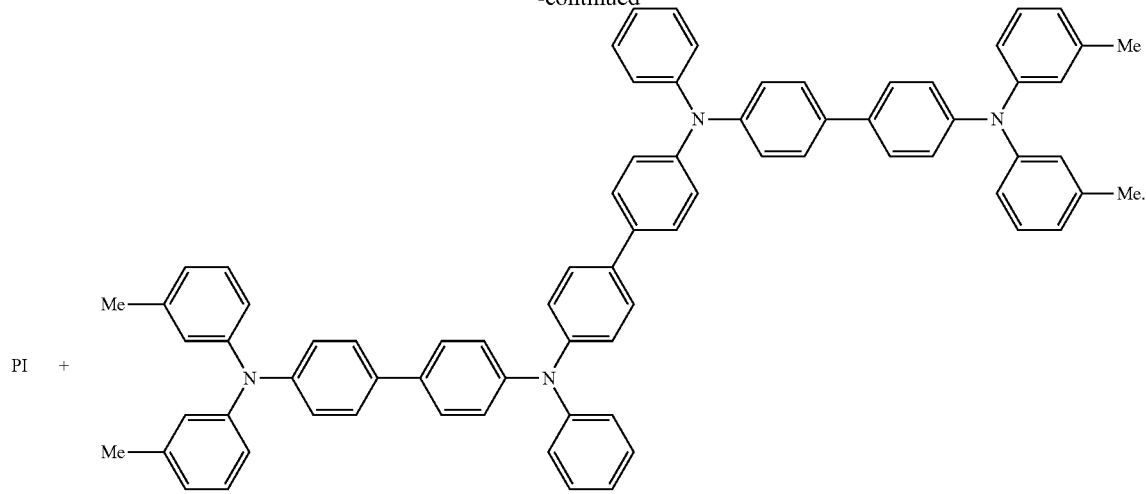

According to another embodiment the storage material is an endcapped polyfluorene of the formula without being restricted thereto:

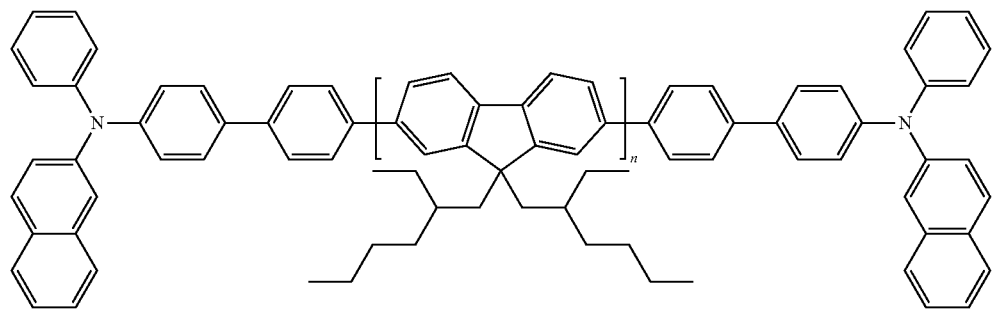

Preferably, the material is aligned on a substrate by the use of alignment layers or by other methods such as direct mechanical rubbing, by using an electric field or magnetic field. The alignment results in dipole reorientation and a better charge transfer from the electrode or between the layer components.

For all storage materials described above exhibiting a charge transfer in an electric field may occur intramolecular or intermolecular to the molecules of the storage material. A charge transfer may also occur between a molecule and a connected electrode. In an intramolecular charge transfer complex the donor and the acceptor moiety are part of the same molecule. The intramolecular charge transfer molecule can be a single molecule, an oligomer or polymer.

The charge transfer storage materials can be applied for example by spin coating on the electrode. A crossbar structure can be provided for the arrangement of the first and second electrodes and alternatively also a probe can be used as the second electrode.

According to another embodiment the material exhibiting a change of polarization upon application of an electrical current is at least one insolating dielectric organic material sustaining a quasi-permanent external electrical field in a polarized condition. Preferably, the material has an electrical conductivity $<10^{-12}$ S/m. The insolating dielectric organic material can be a single molecule, an oligomer or a polymer. This material is also referred to as an organic electret.

According to one embodiment the organic electret is one of the group including fluoropolymers (polytetrafluoroethylene, polyvinylidene difluoride, polyfluoroethylene-propylene, perfluoralkoxy, polychloro-trifluoroethylene, amorphous Teflon-AF, polyvinylidene chloride), cycloolefines (COC), polyamides, polyimides, polyesters (polycarbonates (PC), polyethylene terephthalate), polystyrene (PS), polymethyl methacrylate (PMMA), polypropylene, polysulfone, polyethylene, polyvinyl chloride, polyurethane without being restricted thereto.

According to another embodiment electrets include isolating dielectric materials sustaining a quasi-permanent external electric field when polarized by uncompensated monopolar charges (e.g. space-charge electrets) or aligned polar charges (e.g. ferro-electrets).

According to yet another embodiment a material exhibiting a change of polarization upon application of an electrical current is a blend of an organic electret with an acceptor or donor molecule.

According to a further embodiment, the material exhibiting a change of polarization upon application of an electric field is a polar organic electret, i.e. a blend of an isolating dielectric material with a dipole molecule or dipole complex and a molecule with intra-molecular dipoles. The molecules can be single molecules, oligomers or polymers. In particular, the storage material can be a material including a mixture of polymer materials with electron donors and acceptors which are optimized for strong dipole fields.

According to one embodiment the material exhibiting a change of polarization upon application of an electric field is N,N'-Diphenyl-N,N'-bis(4'-(N,N-bis(naptha-1-yl)-amino)-biphenyl-4-yl)benzidine with 5 wt. % of fullerene C61.

According to the present invention, also a method of storing information is provided which comprises steps of providing a memory device according to one of the preceding claims comprising a storage material, applying a voltage pulse to the storage material at a storage location to store information, and reading the information at the storage location.

According to one embodiment, reading the information may comprise measuring of an electric current flowing through the storage material at the storage location and the electrodes or may comprise measuring of an electric field of the storage material at a storage location.

According to a further embodiment, the method may comprise erasing the information by applying a voltage pulse to the storage material at a storage location.

The method may also include, according to another embodiment, moving a probe as an electrode across the storage material to a position where said information is stored.

According to a further embodiment, the method further comprises positioning the probe at a distance from the storage material to read the information.

According to yet another embodiment at least one of reading, writing and erasing of information is performed in dry air. Operating a storage device including an electret thin film in dry air comprising a water content of less than 0.5 g/m² can increase the spot signal strength and can reduce the width of the charge spots enabling a higher data density per area of the storage material.

According to the present invention also a method of manufacture of a memory device is provided. It comprises steps of depositing a storage material on a first electrode, and providing an electrode over the storage material.

According to another embodiment the method comprises depositing the storage material on a substrate. Optionally, an interface layer can be inserted between the electrode and the storage material and alternatively or in addition provided on top of the storage material.

According to one embodiment the method comprises arranging a probe over the storage material that is movable across the surface of the storage material.

According to another embodiment it comprises depositing a fixed electrode on top of the storage material.

According to yet another embodiment the method comprises providing a means that is adjusted to apply a voltage pulse to the storage material at a storage location to store and erase information in the storage material at the storage location.

According to a further preferable embodiment the method comprises providing a means to read information stored in the storage material at a storage location which is adapted to apply and measure an electric current flowing through the storage material at the storage location and the electrodes or adapted to measure an electric field of said storage material at a storage location.

According to yet another embodiment the storage material is one of the group comprising a material exhibiting a change of conductivity upon application of an electric current, a material exhibiting a change of conductivity upon application of an electric field, a material exhibiting a change of polarization upon application of an electrical current, and a material exhibiting a change of polarization upon application of an electric field.

According to one embodiment the storage material exhibiting a change of conductivity upon application of an electric current comprises an electron poor molecule defined by one of the following formulas without being restricted thereto:

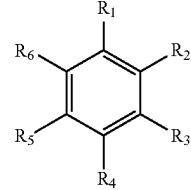

wherein R, $R_1$, $R_2$, $R_3$, $R_4$, $R_5$, $R_6$=C=O, COOH, F, Cl, Br, I, CN, $NO_2$, $NR_3^+$, O—Ar, COOR, OR, COR, SH, SR, $CONH_2$, CONHR, $CONR_2$, CHO, OH, $SO_2R$, $SO_2OR$, NO, C≡CR, Ar; and

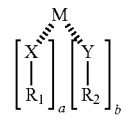

wherein M=transition metal, X, Y=electron withdrawing group like C=O, COOH, F, Cl, Br, I, CN, $NO_2$, $NR_3^+$, N=C, O—Ar, COOR, OR, COR, SH, SR, $CONH_2$, CONHR, $CONR_2$, CHO, C=N, OH, $SO_2R$, $SO_2OR$, NO, C≡CR, Ar and $R_1$, $R_2$=aromatic, allilylic; a, b=integer number.

According to one embodiment the electron poor molecule comprises one of the following formulas without being restricted thereto:

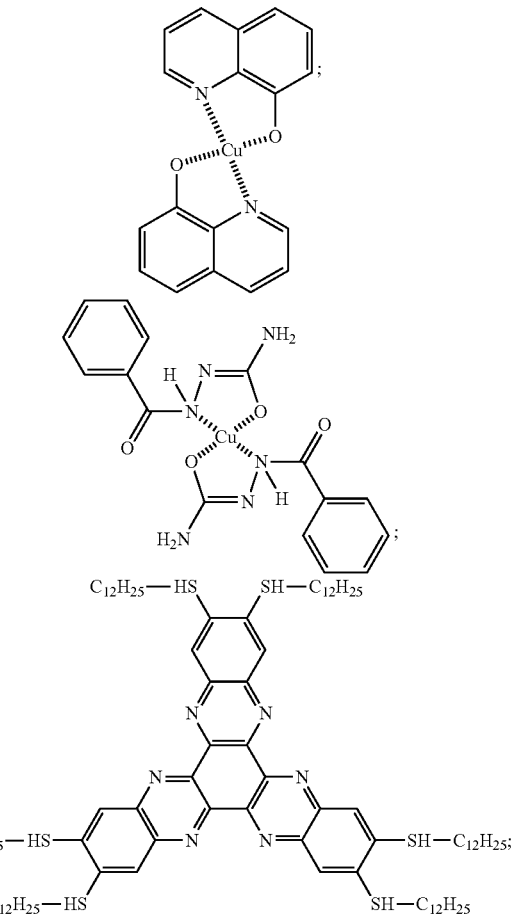

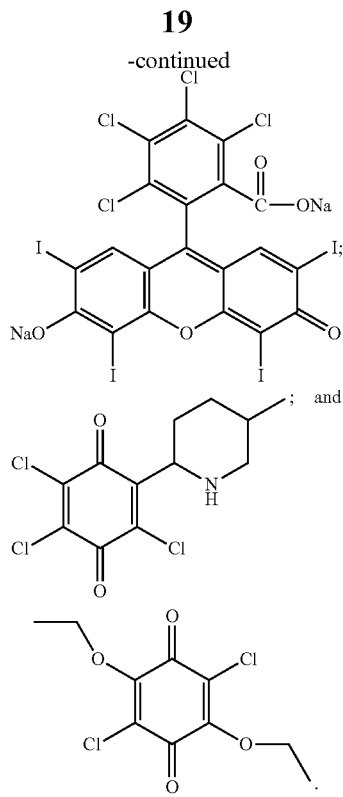

According to still another embodiment the storage material exhibiting a change of conductivity upon application of an electric current comprises a Redox-addressable molecule defined by the following formula without being restricted thereto:

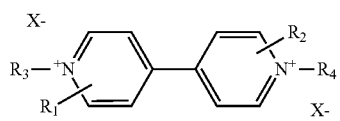

wherein $R_1$, $R_2$, $R_3$, $R_4$=aryl or alkyl and $X^-$=anion.

According to another embodiment the redox-addressable molecule has one of the following formulas without being restricted thereto:

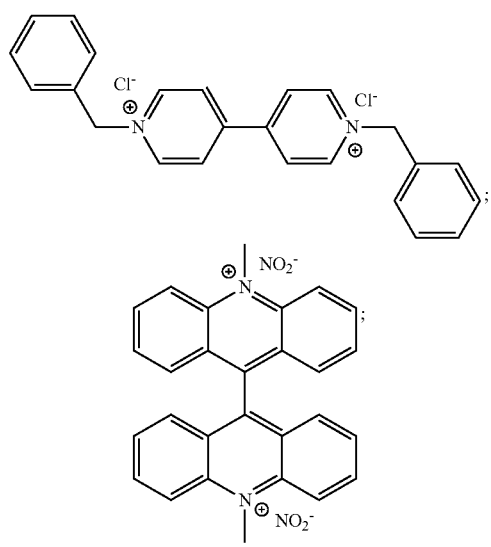

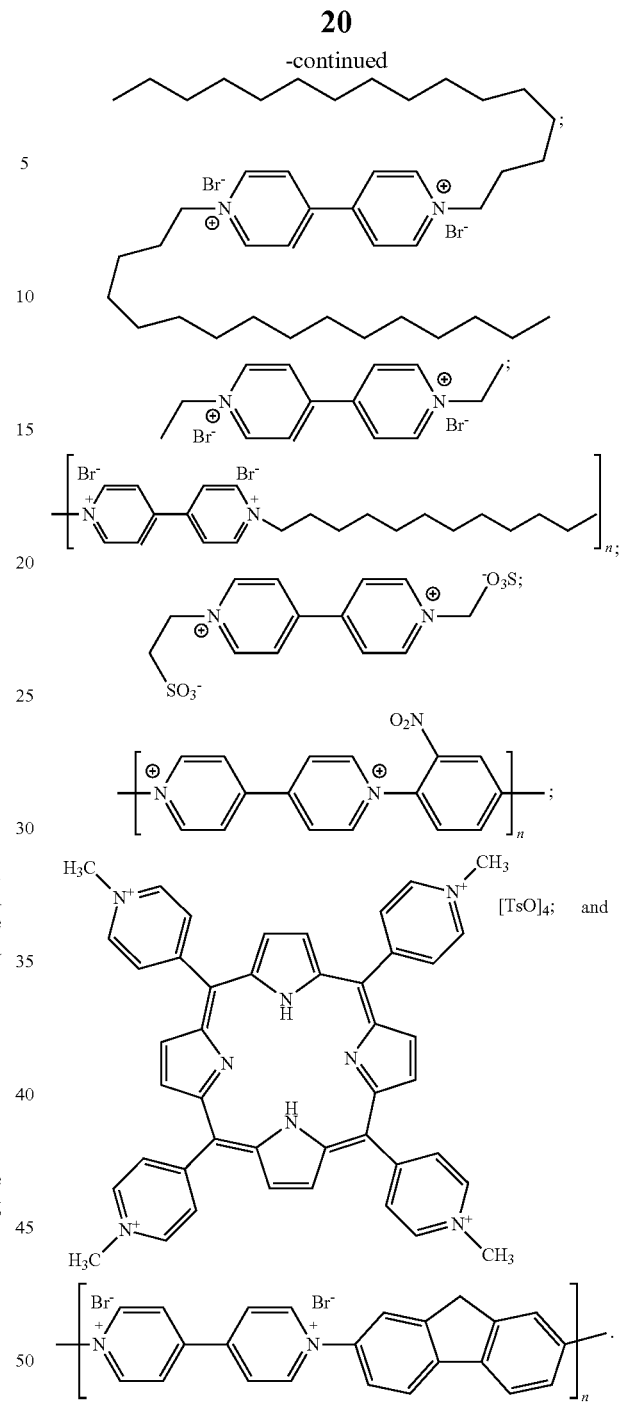

According to yet another embodiment the storage material includes charge transfer components undergoing a charge transfer in response to an application of an electric field or the storage material undergoes a charge transfer with a connected electrode in response to an application of an electric field.

According to one embodiment the storage material comprises a donor molecule containing one or more of the following donor groups without being restricted thereto: $O^-$, $S^-$, $NR_2$, $NAr_2$, $NRH$, $NH_2$, $NHCOR$, $OR$, $OH$, $OCOR$, $SR$, $SH$, $Br$, $I$, $Cl$, $F$, $R$, $Ar$.

According to yet another embodiment the storage material comprises a donor molecule of one of the formulas comprising without being restricted thereto:

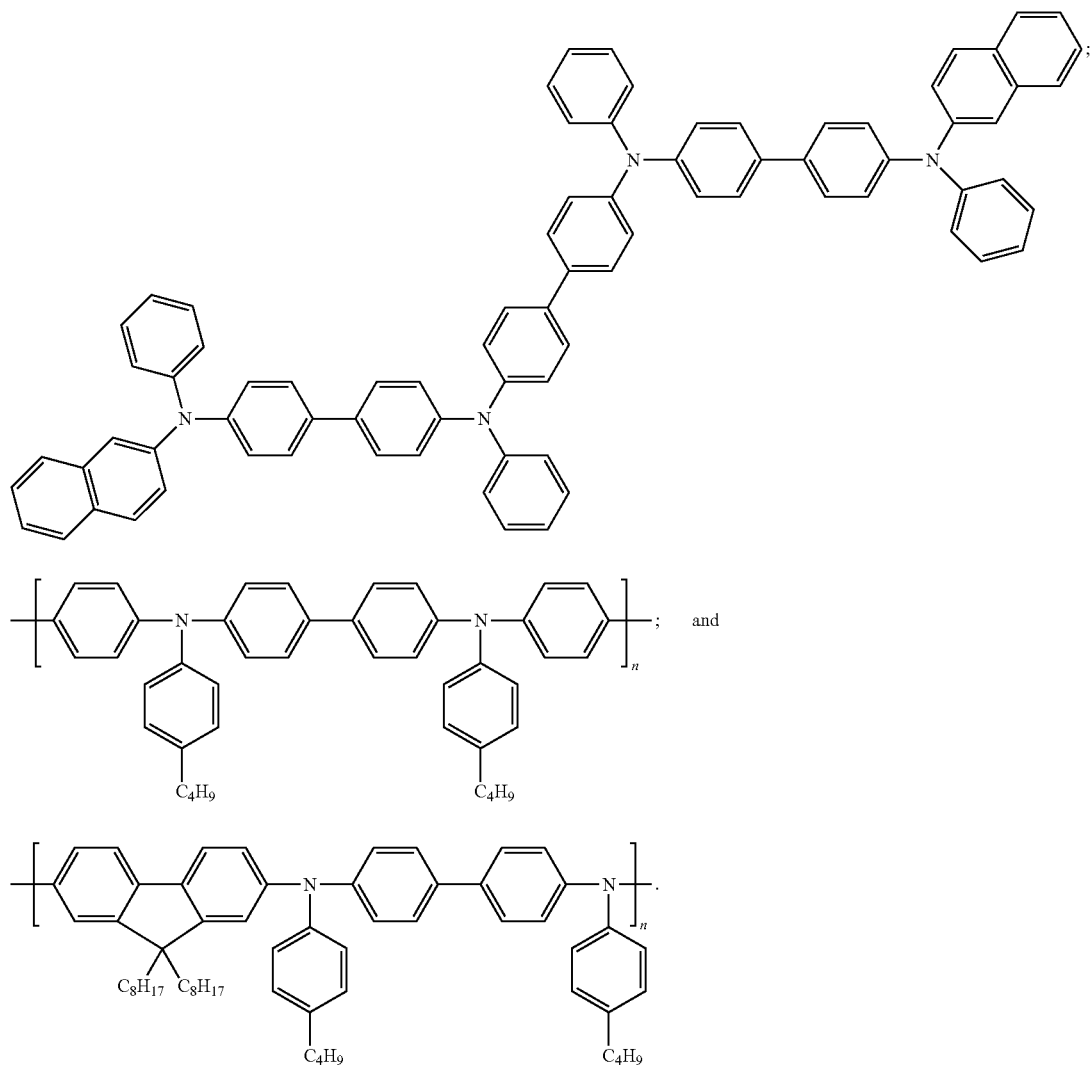

According to one embodiment the storage material includes an acceptor molecule containing one or more of the following acceptor groups without being restricted thereto: $NO_2$, $CN$, $COOH$, $COOR$, $CONH_2$, $CONHR$, $CONR_2$, $CHO$, $COR$, $SO_2R$, $SO_2OR$, $NO$, $Ar$.

According to yet another embodiment the storage material comprises an acceptor of the group of acceptors comprising C60 fullerene, C61 fullerene, fullerene derivatives, CdSe, platinum octaethyl porphine, semiconductor nanodots and electron poor transition metal complexes.

According to another embodiment the storage material undergoing a charge transfer in response to an application of an electric field is a material having conjugated main-chain as well as side-chain liquid crystalline polymers which can be aligned in mono-domain or multidomain structures.

According to one embodiment the material has the following formula without being restricted thereto:

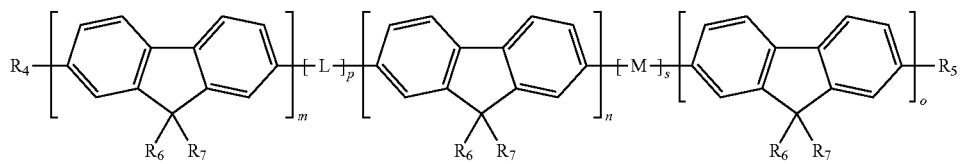

wherein R4 and R5 are independently at each occurrence selected from the group comprising:

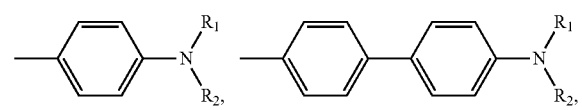

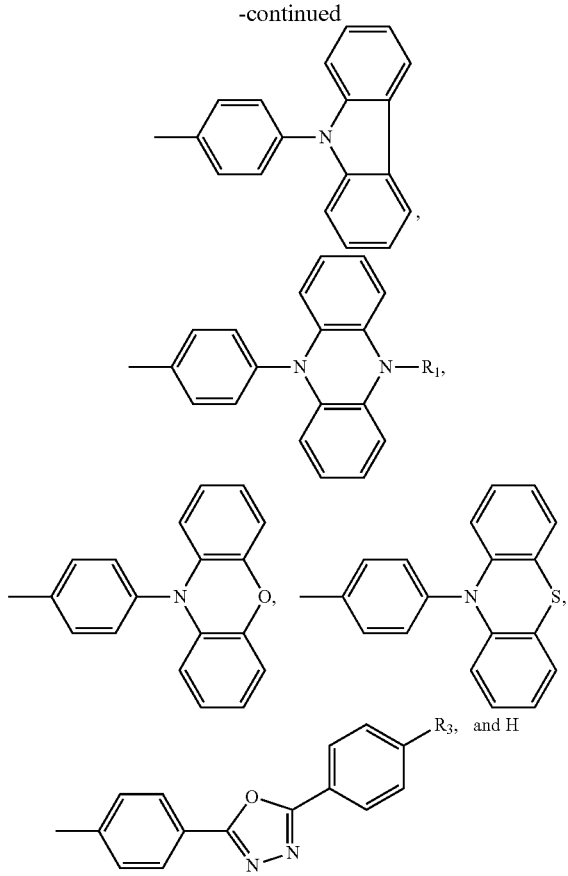

R1 and R2 being independently selected from the group comprising straight chain $C_{1-20}$ alkyl, branched $C_{1-20}$ alkyl, aryl, substituted aryl, alkylaryl, substituted alkylaryl, alkoxyaryl, substituted alkoxyaryl, aryloxyaryl, substituted aryloxyaryl, dialkylaminoaryl, substituted dialkylaminoaryl, diarylaminoaryl and substituted diarylaminoaryl, R3 being selected from the group comprising straight chain $C_{1-20}$ alkyl, branched $C_{1-20}$ alkyl, aryl, substituted aryl, alkylaryl and substituted alkylaryl, and wherein R6 and R7 are independently at each occurrence selected from the group comprising straight chain $C_{1-20}$ alkyl, branched chain $C_{1-20}$ alkyl, aryl, substituted aryl, alkylaryl, substituted alkylaryl, $-(CH_2)_q-(O-CH_2-CH_2)_r-O-CH_3$, q being selected from the range $1<=q<=10$, r being selected from the range $0<=r<=20$, and wherein L and M are independently at each occurrence selected from the group comprising thiophene, substituted thiophene, phenyl, substituted phenyl, phenanthrene, substituted phenanthrene, anthracene, substituted anthracene, any aromatic monomer that can be synthesized as a dibromo-substituted monomer, benzothiadiazole, substituted benzothiadiazole, perylene and substituted perylene, and wherein $m+n+o<=10$, each of m, n, o being independently selected from the range 1-1,000, and wherein p is selected from the range 0-15, and wherein s is selected from the range 0-15, with the proviso that, if R4 is H, R5 is not H, and if R5 is H, R4 is not H.

According to another embodiment the material has the following formula without being restricted thereto:

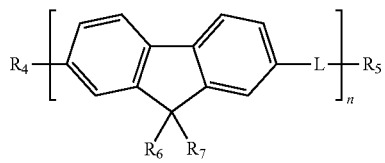

wherein L independently at each occurrence is selected from the group consisting of thiophene, substituted thiophene, phenyl, substituted phenyl, phenanthrene, substituted phenanthrene, anthracene, substituted anthracene, any aromatic monomer that can be synthesized as a dibromo-substituted monomer, benzothiadiazole, substituted benzothiadiazole, perylene and substituted perylene, and wherein $R_6$ and $R_7$ are independently at each occurrence selected from the group consisting of straight chain $C_{1-20}$, branched chain $C_{1-20}$ alkyl, aryl, substituted aryl alkylaryl, $-(CH_2)_q-(O-CH_2\_CH_2)_r-O-CH_3$, q being selected from the range 1-10, r being selected from the range 0-20 and wherein R4 and R5 are independently at each occurrence selected from the group comprising:

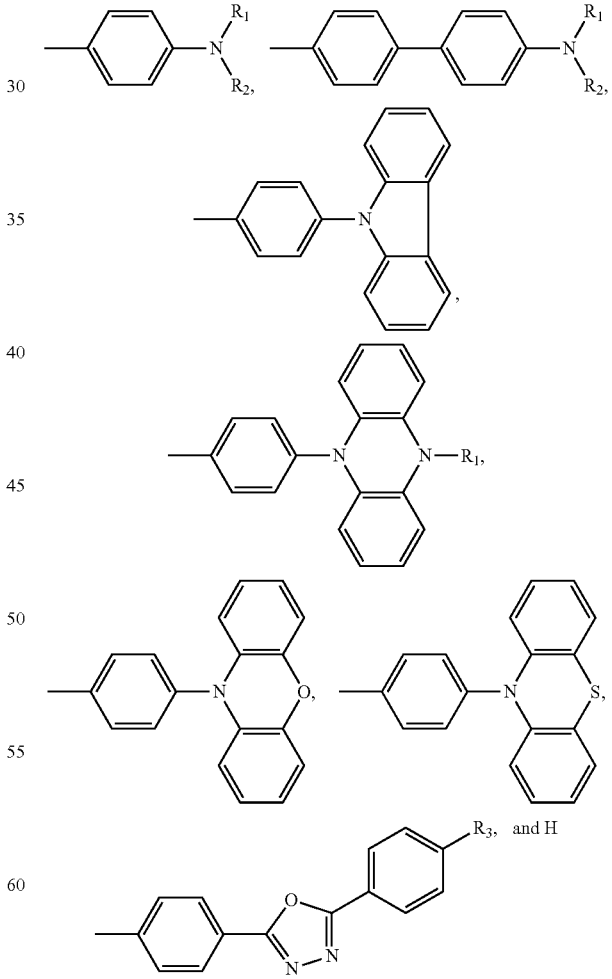

According to yet another embodiment the material has one of the following formulas without being restricted thereto:

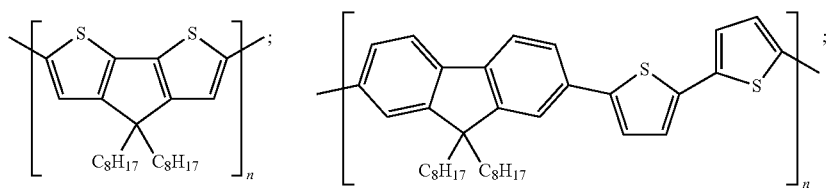
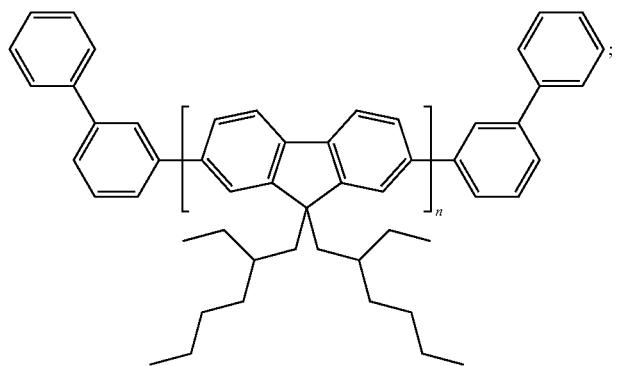
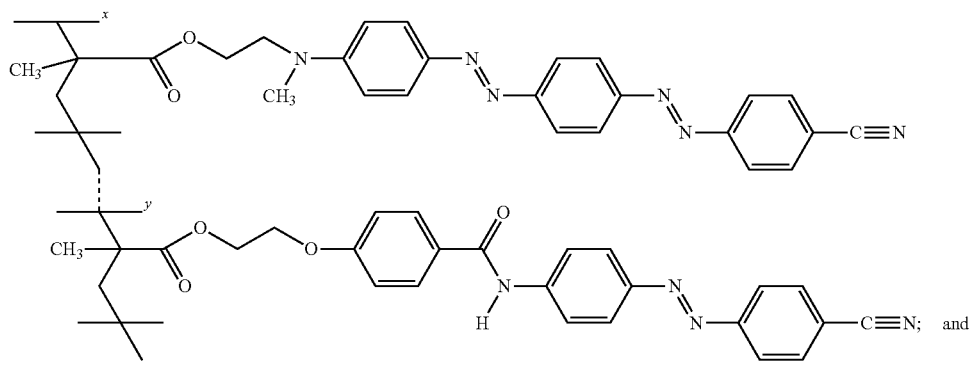
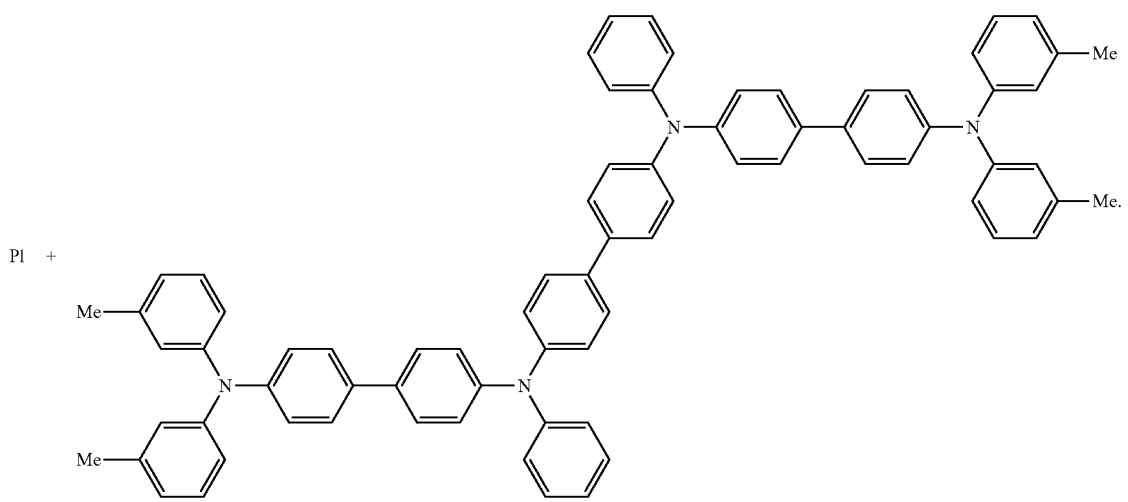
According to another embodiment the storage material is an endcapped polyfluorene of the formula without being restricted thereto:

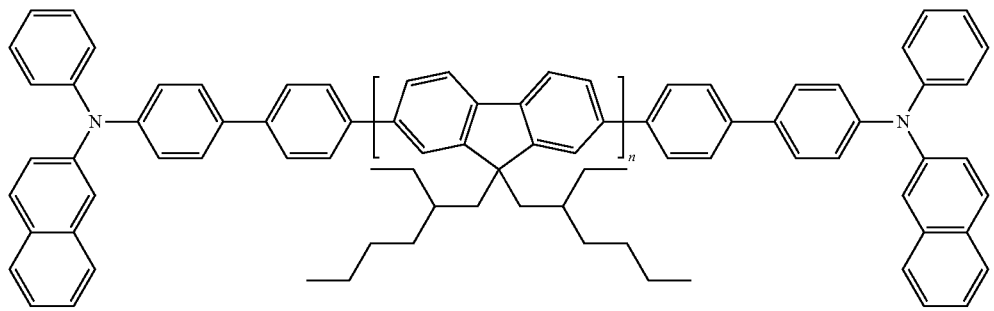

Preferably, the material is aligned by the use of alignment layers or by other methods such as direct mechanical rubbing, using an electric field or magnetic field. It results in dipole reorientation and a better charge transfer from the electrode or between the layer components.

For all charge transfer materials described above a charge transfer may occur intramolecular or intermolecular to the molecules of the storage material. Alternatively, or in addition a charge transfer may also occur between a molecule and a connected electrode. In an intramolecular charge transfer complex the donor and the acceptor moiety are part of the same molecule. The intramolecular charge transfer molecule can be a single molecule, an oligomer or polymer.

The charge transfer storage materials can be applied for example by spin coating on the electrode. A crossbar structure can be provided for the arrangement of the first and second electrodes and alternatively also a probe can be used as the second electrode.

According to another embodiment the material exhibiting a change of polarization upon application of an electrical current is at least one insolating dielectric organic material sustaining a quasi-permanent external electrical field in a polarized condition. Preferably, it has an electrical conductivity $<10^{-12}$ S/m. The insolating dielectric organic material can be a single molecule, an oligomer or a polymer. This material is also referred to as electret.

According to one embodiment the organic electret is one of the group including fluoropolymers (polytetrafluoroethylene, polyvinylidene difluoride, polyfluoroethylene-propylene, perfluoralkoxy, polychloro-trifluoroethylene, amorphous Teflon-AF, polyvinylidene chloride), cycloolefines (COC), polyamides, polyimides, polyesters (polycarbonates (PC), polyethylene terephthalate), polystyrene (PS), polymethyl methacrylate (PMMA), polypropylene, polysulfone, polyethylene, polyvinyl chloride, polyurethane.

According to another embodiment the electret includes an isolating dielectric material sustaining a quasi-permanent external electric field when polarized by uncompensated monopolar charges (e.g. space-charge electrets) or aligned polar charges (e.g. ferro-electrets).

According to another embodiment the material exhibiting a change of polarization upon application of an electrical current is a blend of an organic electret with an acceptor or donor molecule.

According to a further embodiment, the material exhibiting a change of polarization upon application of an electric field is a polar organic electret, i.e. a blend of an isolating dielectric material with a dipole molecule or dipole complex and a molecule with intra-molecular dipoles. The molecules can be single molecules, oligomers or polymers. In particular, it can be a material including a mixture of polymer materials with electron donors and acceptors which are optimized for strong dipole fields.

According to still another embodiment the material exhibiting a change of polarization upon application of an electric field is N,N1-Diphenyl-N,N1-bis(4'-(N,N-bis(naphth-yl 1)-amino)biphenyl-4-yl)benzidine with 5 wt. % of fullerene C61.

Further aspects of the present invention will result from the following description of a preferred embodiment of the invention in conjunction with the accompanying drawings.

FIG. 1 is a schematic cross-sectional view of a memory device according to embodiments of the present invention. It shows on the right side a probe electrode having a cantilever tip positioned for writing or reading information in a storage material and on the left side a fixed top electrode;

FIG. 2a shows a schematic cross-sectional view of a memory device according to one embodiment of the present invention including a probe in contact with a bistable storage material for writing and erasing bits;

FIG. 2b shows the cross-sectional view of a memory device according to the present invention including a probe lifted to a certain distance above the surface of the storage material;

Figure 3:
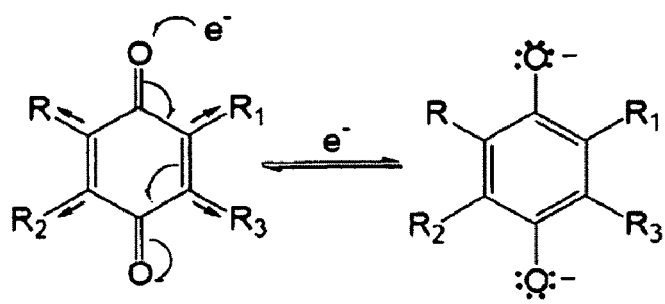
Figure 4:
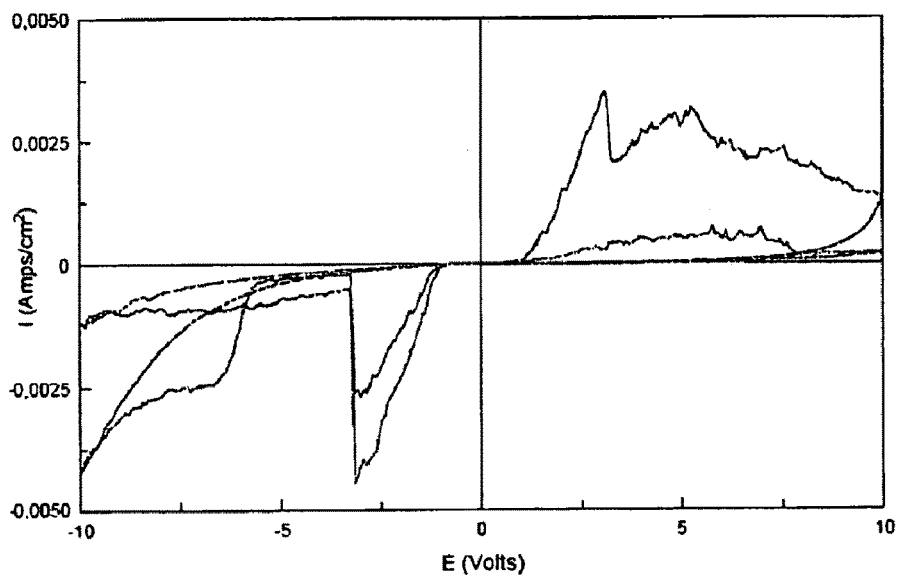
Figure 5A:
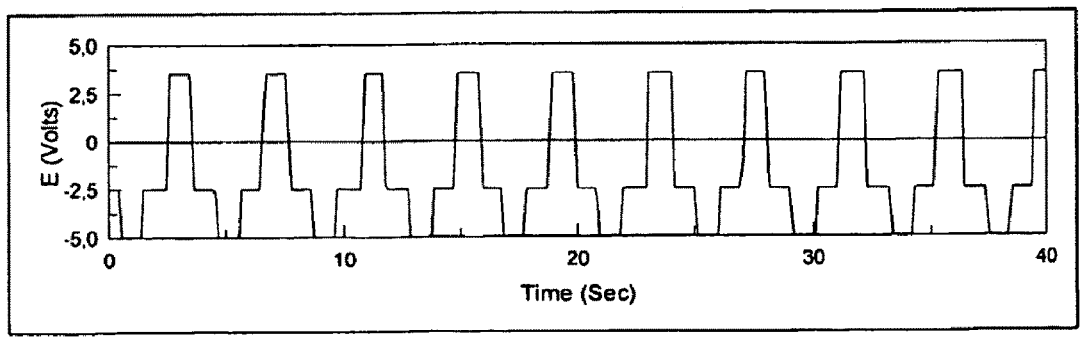
Figure 5B:
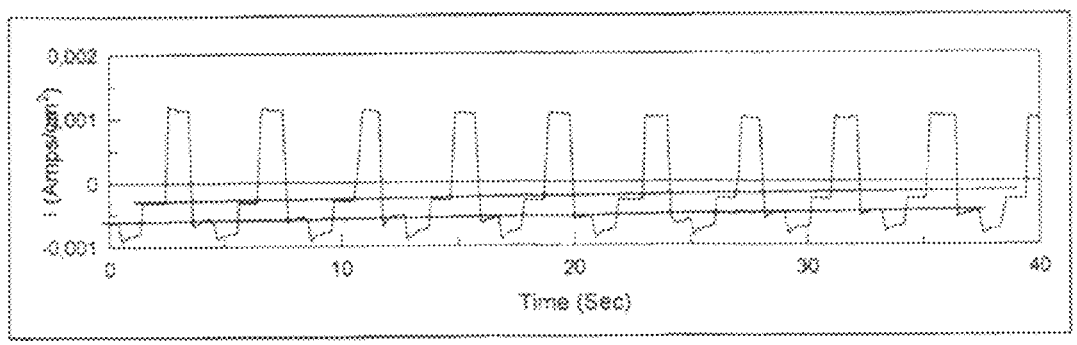
Figure 6:
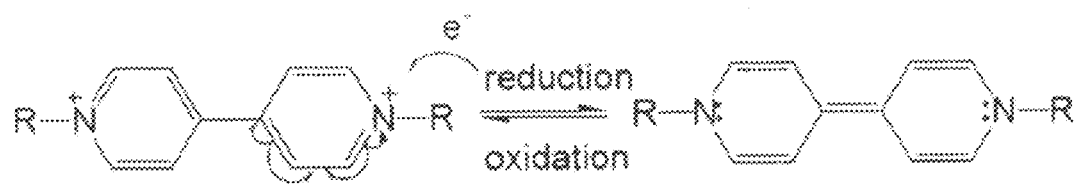
Figure 8:
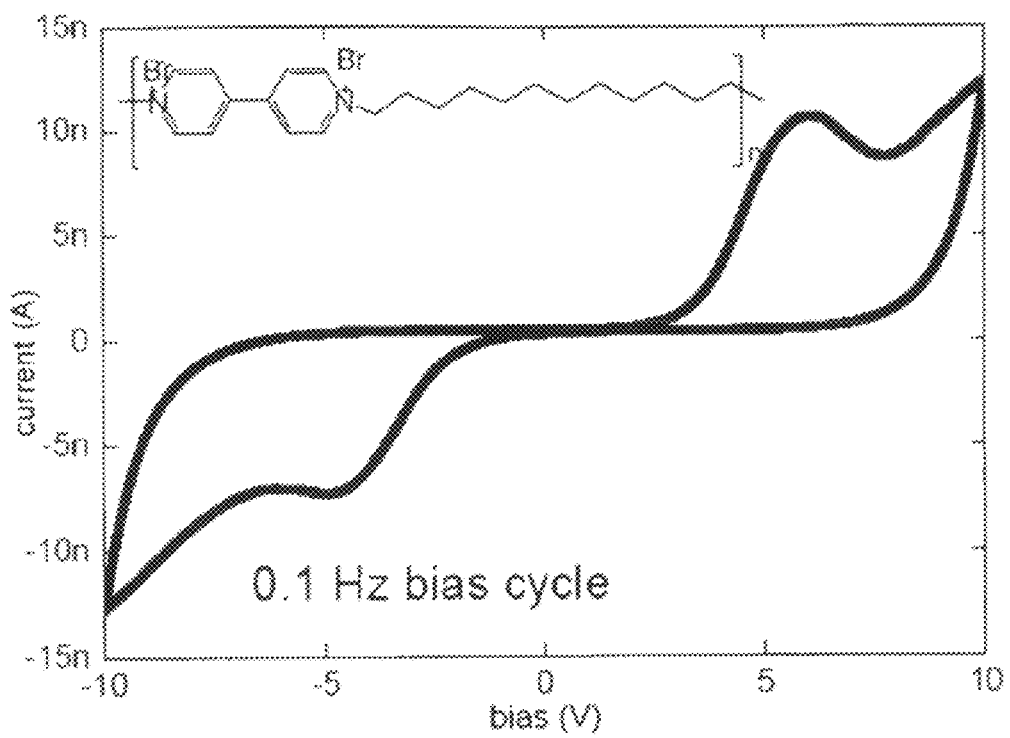
Figure 9A:
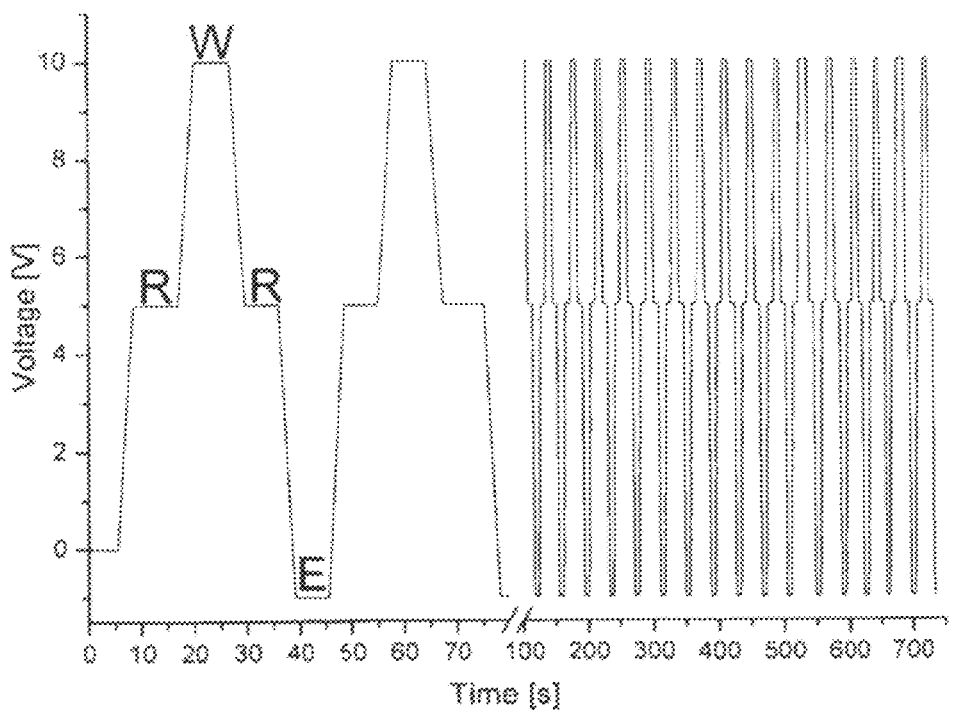
Figure 9B:
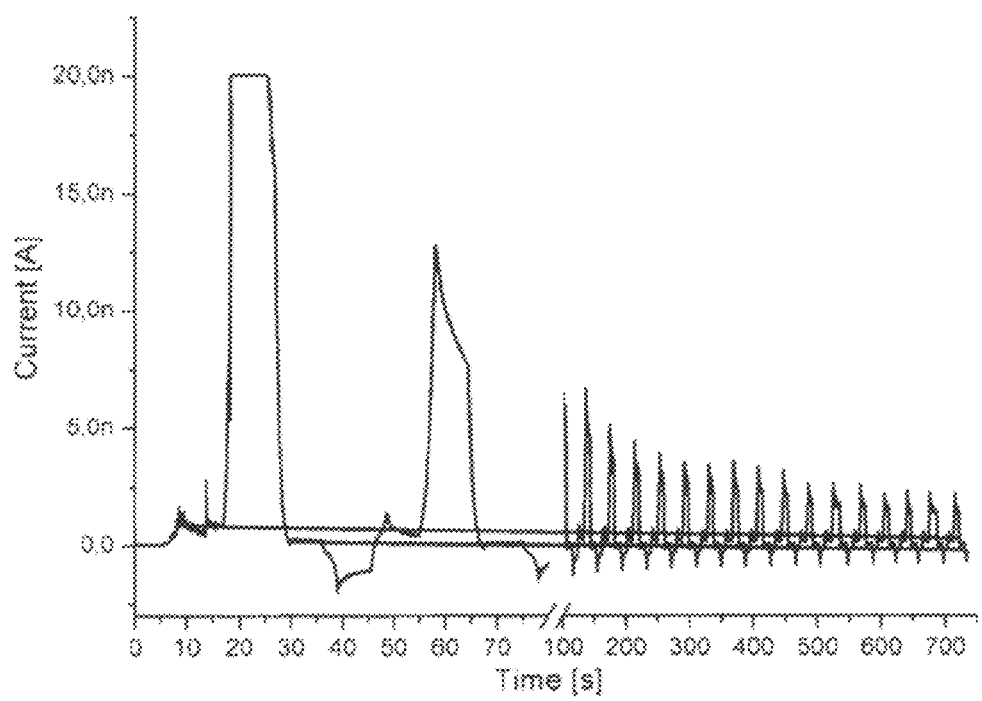
Figure 10:
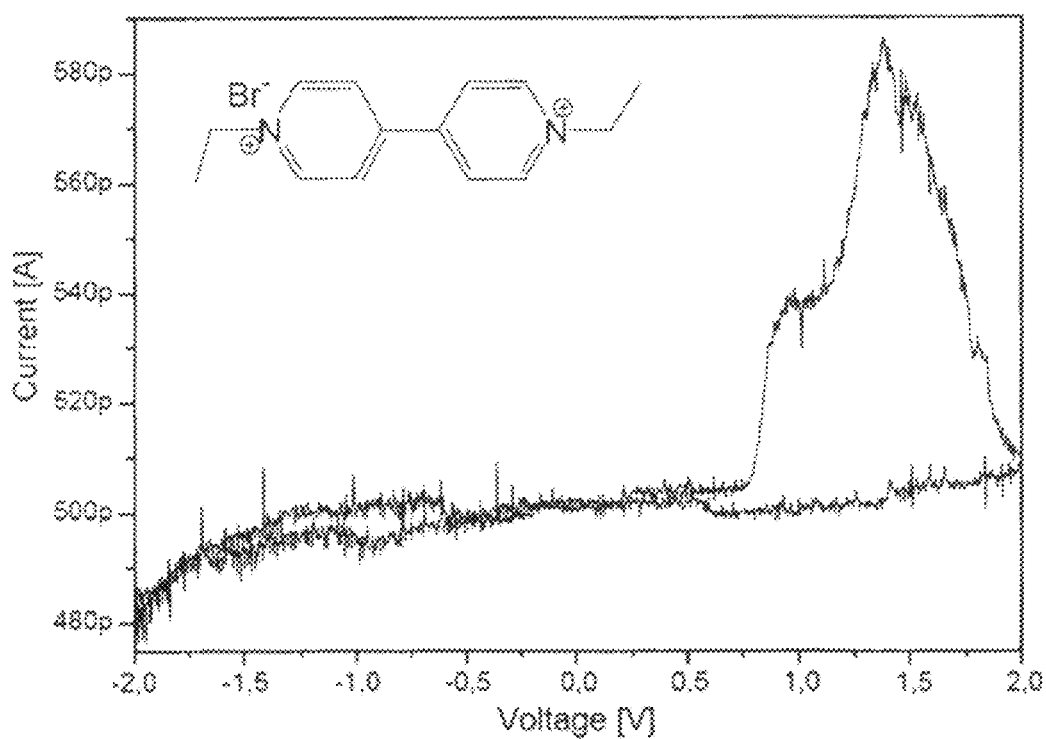
Figures 11A, 11B, 11C:
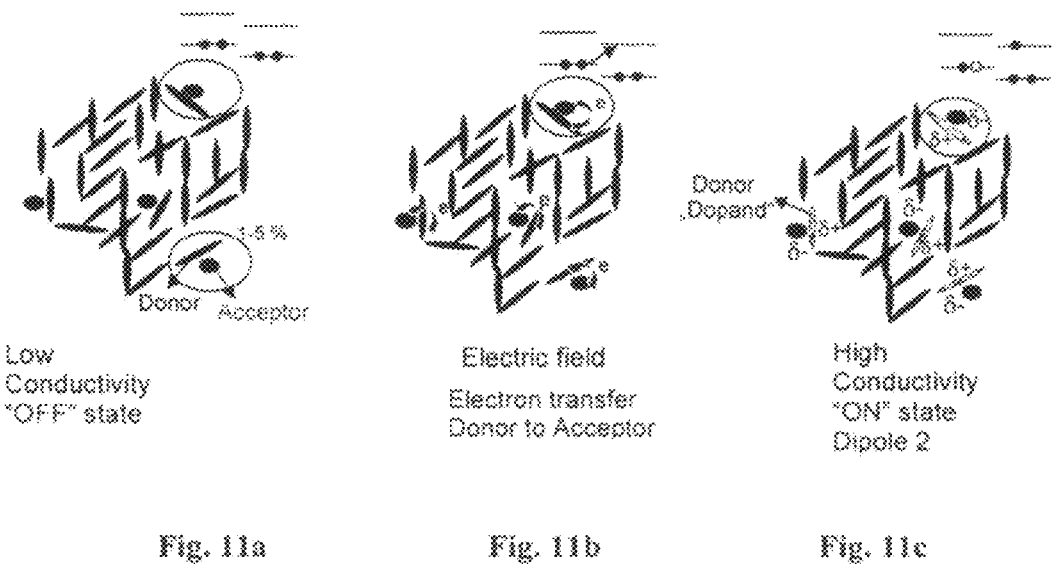
Figure 12:
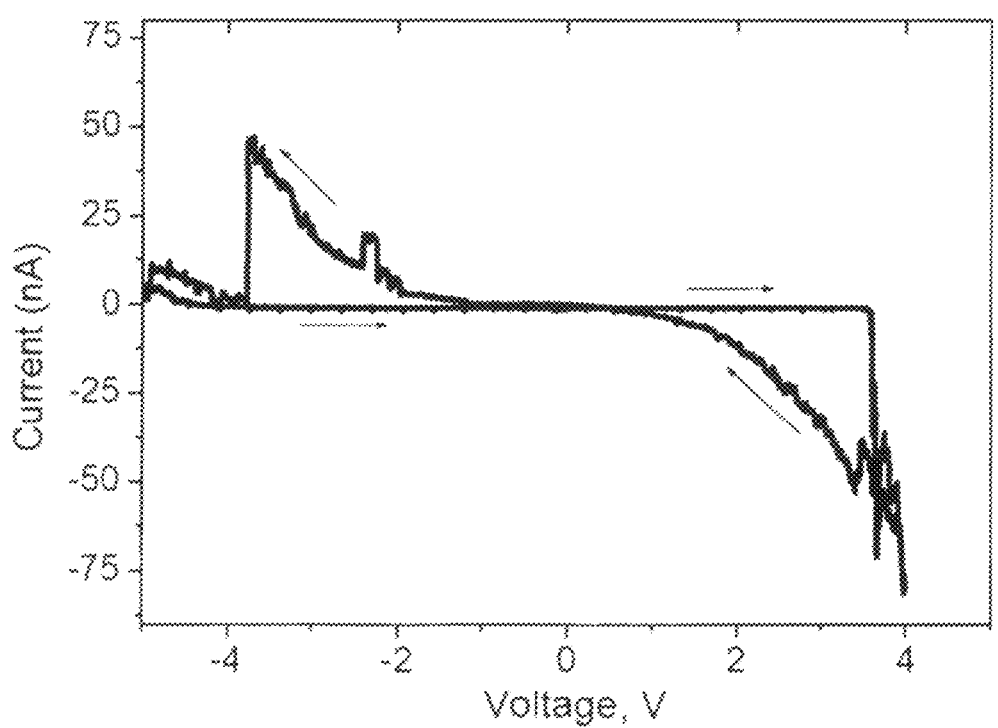
Figure 15:
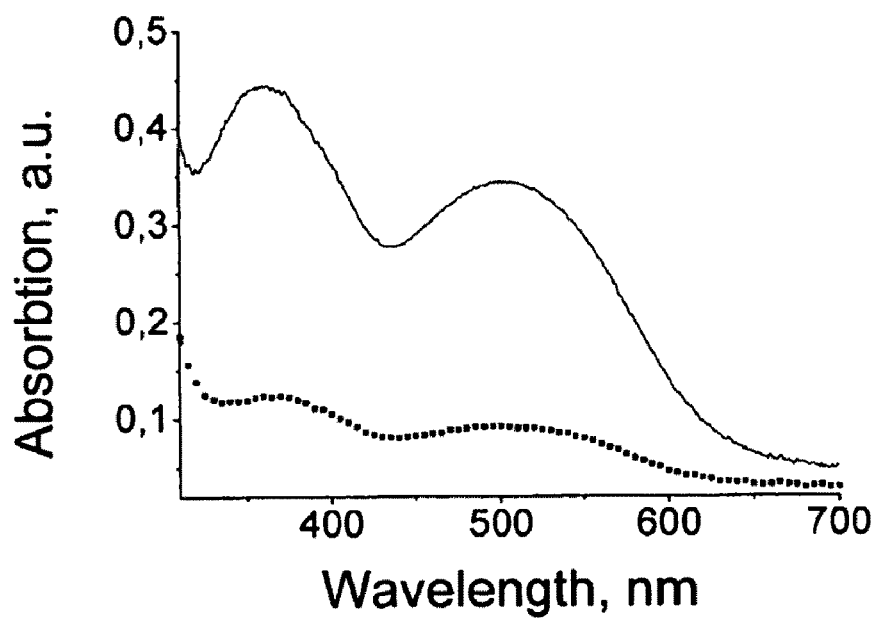
Figure 16:
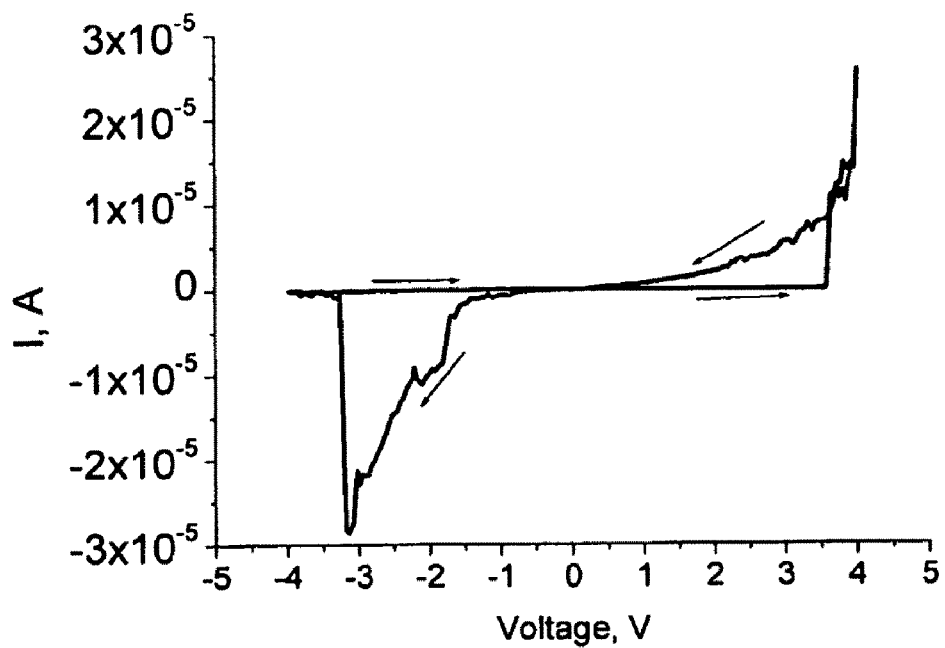
Figure 17:
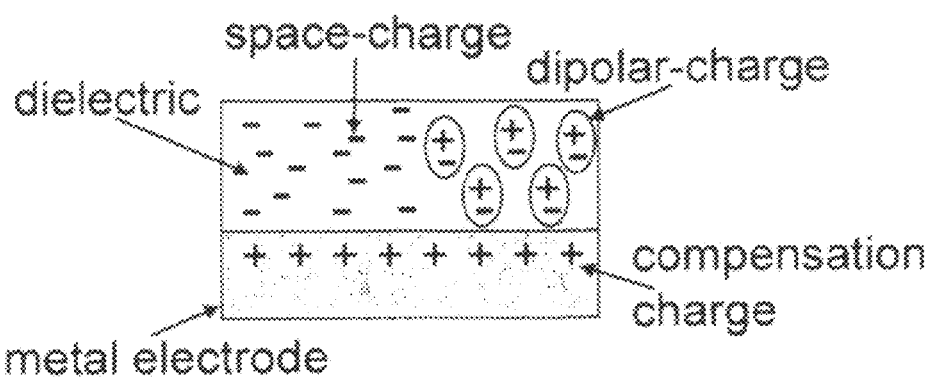
Figure 18:
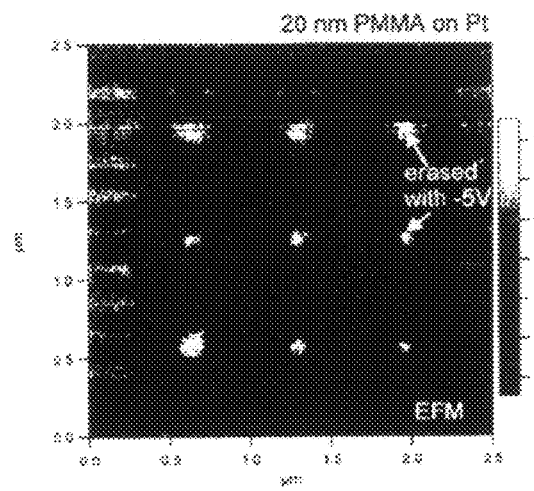
Figure 19:
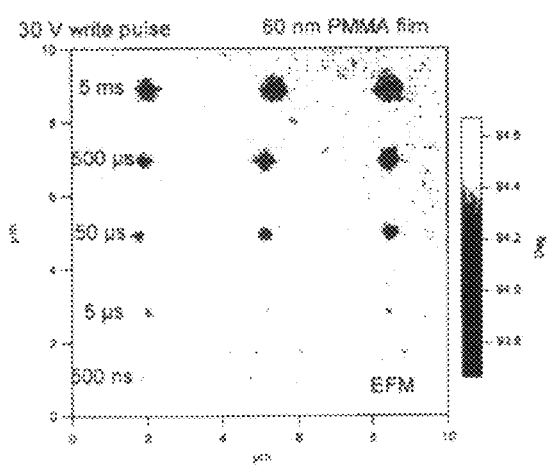
Figure 20:
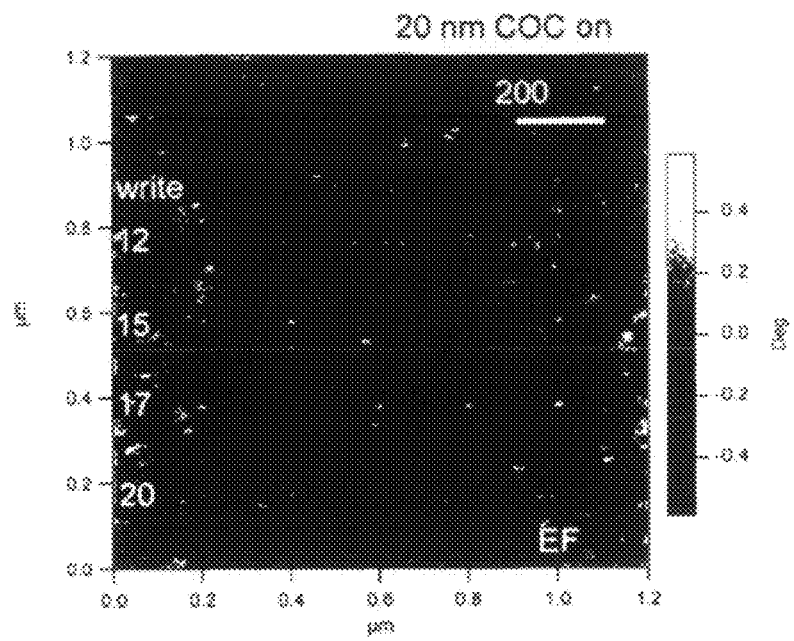
Figure 21:
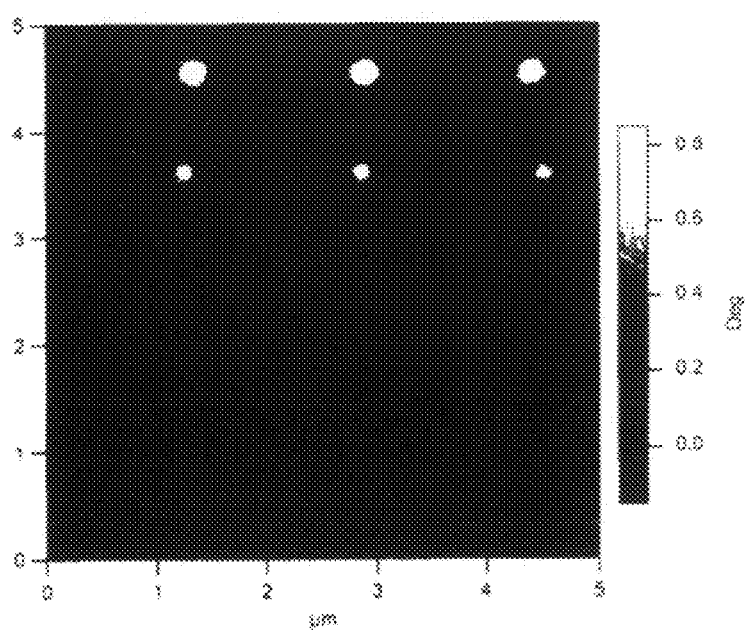

FIG. 3 schematically illustrates a current driven conductivity change in an electron poor molecule;

FIG. 4 illustrates a current-voltage-(I-V)-characteristic of a storage material comprising an electron poor molecule;

FIG. 5a illustrates a voltage-time-(V-T)-characteristic of repeated read-write-delete operations of the storage material of FIG. 4;

FIG. 5b illustrates a current-time-(V-T)-characteristic of repeated read-write-delete operations of the storage material of FIG. 4;

FIG. 6 schematically illustrates a current driven conductivity change in a Redox-addressable molecule;

FIG. 7a-d show conductive atomic force microscope (AFM-topography) pictures and electric force microscope (EFM) pictures of a layer comprising a Redox-addressable molecule;

FIG. 8 shows a current-voltage-(I-V)-characteristic of a storage material comprising a Redox-addressable molecule;

FIG. 9a illustrates a voltage-time-(V-T)-characteristic of repeated read-write-delete operations of the storage material comprising a Redox-addressable molecule of FIG. 8;

FIG. 9b illustrates a current-time-(V-T)-characteristic of repeated read-write-delete operations of the storage material comprising a Redox-addressable molecule of FIG. 8;

FIG. 10 illustrates a current-voltage-(I-V)-characteristic of a storage material comprising another Redox-addressable molecule;

FIG. 11a-c show a schematic graphic representation of a change of conductivity in a charge transfer complex upon application of an electric field;

FIG. 12 illustrates a current-voltage-(I-V)-characteristic of a storage material comprising an organic charge transfer complex;

FIG. 13a-b illustrate current-voltage-(I-V)-characteristics of a storage material comprising an organic charge transfer complex with and without an acceptor molecule;

FIG. 14 illustrates a current-voltage-(I-V)-characteristic of a sample comprising an oriented active layer in which charge transfers from the electrode to the molecules in the active layer occur;

FIG. 15 illustrates an absorption characteristic of the active layer of the sample of FIG. 14;

FIG. 16 illustrates a current-voltage-(I-V)-characteristic of another sample comprising an oriented active layer in which charge transfers from the electrode to the molecules in the active layer occur;

FIG. 17 shows a graphic cross-sectional representation of a sample comprising an electret;

FIG. 18 shows an EFM phase change image of charge spots of a PMMA film written and erased with a tip electrode;

FIG. 19 shows an EFM phase change image of charge spots of a PMMA film written with a tip electrode and with varying pulse widths;

FIG. 20 shows an EFM phase change image of charge spots of a COC film written with a tip electrode and with varying write pulse voltages;

FIG. 21 shows an EFM phase change image of charge spots of a PC film written with a tip electrode and with varying pulse widths;

FIG. 22a-b show EFM phase change images of a polarized area of a material layer.

In the following an embodiment of the present invention will be described with reference to FIGS. 1, 2a and 2b. As is shown in FIG. 1, the memory device according to one embodiment comprises a substrate 1, which can be of any suitable material such as glass, plastic such as PET, PEN, PC, etc., semiconductor such as Si, Ge, etc., or ITO. On top of the substrate 1 an electrode layer 3 is provided. Electrode layer 3 can be of any material that is suitable for an electrode, such as Au, Pt, Al, Ag, etc., a semiconductor such as Si, Ge, ITO, FTO, etc. or a conductive polymer such as doped PANI, PEDOT, PT, etc. but is not restricted thereto.

Optionally, an interface layer 5 is deposited on top of electrode layer 3. It can comprise PEDOT-PSS, PANI, silane, ammines, LiF, 4-chlorobenzoylchloride (CBC), 4-chlorobenzenesulfonyl chloride (CBS), 4-chlorophenyldichlorophosphate (CBP) etc. without being restricted thereto. Interface layer 5 has the function to improve charge injection, adjust if necessary the work function, limit surface roughness and limit diffusion in an active layer of storage material.

On top of the interface layer 5 a continuous active layer 7 of a storage material is deposited. It includes at least one material of the group comprising a material exhibiting a change of conductivity upon application of an electric current, a material exhibiting a change of conductivity upon application of an electric field, a material exhibiting a change of polarization upon application of an electric current and a material exhibiting a change of polarization upon application of an electric field.

On top of the storage material a further interface layer 9 can be deposited.

As shown in the left part of FIG. 1 storage locations 11 of the memory device are defined and accessed by a second electrode 13 which is fixed to the active layer 7 including the storage material. The second electrode 13 can be deposited by any suitable deposition technique. Electrode 13 may be of the same material as electrode 3. Alternatively, as is shown on the right side of FIG. 1, the second electrode or top electrode can be a movable probe comprising a cantilever 15 with a tip 17 that can be moved across the surface of the active layer 7 in a plane that is basically parallel to the surface of the active layer 7. Preferably, the probe is also movable in a vertical direction with respect to the surface of the active layer 7 to control the distance between the tip 17 and the surface of the active layer 7 and to bring the tip 17 into contact with the surface. The area of a storage location 11 on the surface of the active layer 7 is substantially determined by the size of the electrode tip 17. Thus also the density of storage locations 11 on the surface of the active layer 7 depends on the tip size that comes into contact with the surface.

As shown in FIG. 1, the layer 7 is continuous and the storage locations 11 are not separated by any discontinuities or by any material. In case of a continuous active layer 7 the positions of the storage locations are defined by the positions to which the probe is moved to write information into the storage material. However, also a discontinuous active layer may be provided in other embodiments. A discontinuous active layer can for example comprise separated areas of storage material that correspond to single storage locations. Also the number of material layers shown in FIG. 1 is exemplary and other embodiments may comprise additional or less layers.

In order to realize a cross-bar structure, the fixed second top electrode 13 and the first electrode layer 3 can be provided as a series of parallel strips crossing each other for example at 90° and sandwiching between them the active layer 7. In a cross-bar structure the storage locations 11 defined in the active layer 7 at the crossing points of the stripes can be distinctly addressed by selecting single strips of the first and second electrode 3, 13. Furthermore, it is conceivable to provide only one of the electrodes, preferably the top electrode 13 as strips.

According to the second embodiment shown on the right side of FIG. 1, storage locations 11 are addressed by moving probe across the surface of the active layer 7 to write, read and erase storage locations 11.

Information is written and erased in the storage locations 11 by application of voltage pulse from a power source 19 to the storage material at a storage location 11 and read either by a current measurement as or by a detection of an electric field at the storage location 11.

For current driven conductivity and polarization change materials writing and erasing of information is preferably done with the electrode 13 or probe being in contact with the storage material at the storage location 11 (as shown in FIG. 2a for a memory device comprising a probe). Reading of information can be done with the electrode 13 or probe in contact with the storage material or without a physical contact between the probe and the storage material as is shown in FIG. 2b. Conductivity or polarization at a storage location 11 or a change thereof is detected by applying an electrical current to the storage location 11 and measuring the voltage decay at the storage location 11 or by detecting the electric field, its gradient or a change thereof at the storage location 11.

For electric field driven conductivity and polarization change materials writing, reading and erasing of information at a storage location can be done with the electrode or probe in contact with the storage material or without a physical contact between the probe and the storage material as is shown in FIG. 2b. To measure or detect conductivity or polarization of a storage location 11 the electric field or its gradient or a change thereof is measured at the electrode or tip 17.

Furthermore, reading, writing and erasing of information can be performed in a dry air atmosphere comprising a water content of for example less than 0.5 g/m$^2$. An operation of a device including an electret thin film as an active layer 7 under these conditions results in an increase of the spot signal strength from a storage location 11 and in a reduction of the width of the charge spots. This enables a higher number of storage locations 11 per area of the device.

The current driven conductivity change materials used in the inventive memory device are classified in two main categories including electron poor molecules and Redox-adressable molecules.

FIG. 3 schematically illustrates a current driven conductivity change in an electron poor molecule. The molecule in the left part and in the right part of FIG. 3 show how the charge distribution and thus conductivity of the molecule changes by a current applied to the molecule and by binding additional electrons to electron binding groups of the molecule. In the following an example of a memory device with a layer of electron poor molecules is given.

EXAMPLE 1

Active films of hexaazatrinaphthylene (HATNA) were prepared by spin coating of a chloroform solution on ITO/PEDOT substrates. The films have been dried under vacuum overnight and then Aluminium electrodes were deposited thought a mask (0.25 mm$^2$). Performing cyclovoltametry a clear bistability could be detected. The current-voltage-(I-V)-characteristic of the sample is shown in FIG. 4.

Under application of a voltage profile an ON-OFF ratio of 2.3 within 20 cycles was measured. FIG. 5a illustrates a voltage-time-(V-T)-characteristic of repeated read-write-delete operations of the sample. FIG. 5b illustrates a current-time-(V-T)-characteristic of repeated read-write-delete operations of the sample.

EXAMPLE 2

FIG. 6 schematically illustrates a current driven conductivity change in a Redox-addressable molecule. In a redox addressable molecule the injection of electrons by an electric current chemically reduces the molecule and the increased amount of electrons in the n*orbitals increases the conductivity of the material which is transferred from a low conduction state (OFF) to a high conduction state (ON).

Films of Redox-addressable octadecyl viologen dibromide were prepared by Langmuir Blodgett technique (10 layers were transferred) on ITO substrates. The films have been dried under vacuum overnight and then measured by CAFM (conductive atomic force microscopy).

Writing was done in contact mode, and reading was done in non contact mode using EFM (electric force microscopy). A re-writability was measured within 2 µm spot size.

Figures 7A, 7B:
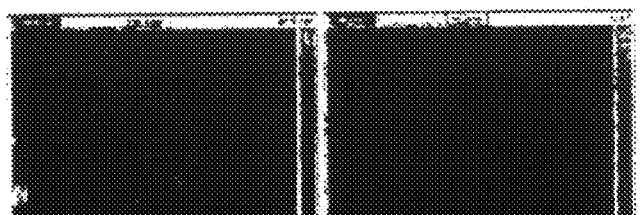

FIG. 7a shows a current image of a writing operation of an area of 2.5 µm at 8 V with CAFM in contact and FIG. 7b a phase image of a reading of an area of 5 µm at 0.5 V at a distance d=50 nm with EFM.

Figures 7C, 7D:
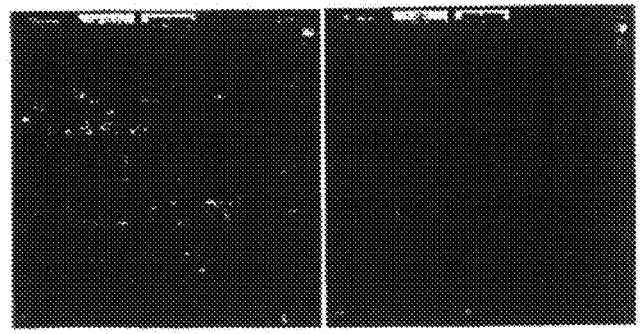

FIG. 7c shows a current image of a writing operation of a region of 5 µm at −10 V with CAFM in contact and a re-writing of a region of a central region of 2 µm at 10 V with CAFM in contact. FIG. 7d shows a phase image of a reading of an area of 10 µm at 0.5 V at a distance d=50 nm between the probe tip and the surface of the active layer with EFM.

EXAMPLE 3

Films of Redox-addressable poly(viologen-co-dodecane) were prepared by spin coating of a chloroform/ethanol solution on ITO/PEDOT substrates. The films have been dried under vacuum overnight and then aluminium electrodes were deposited thought a mask (250 µm$^2$). Performing a cyclovoltametry cycle contacting the electrodes with CAFM in contact mode, a clear bistability could be detected with an ON-OFF ratio of 2.5 within 16 cycles. FIG. 8 shows a current-voltage-(I-V)-characteristic of the films.

FIG. 9a illustrates a voltage-time-(V-T)-characteristic of repeated read-write-delete operations of the films. FIG. 9b illustrates a current-time-(V-T)-characteristic of repeated read-write-delete operations of the films, wherein the reading voltage was 5V, writing voltage was 10V and the erase voltage was −1V. The current that is read before applying the erasing voltage represents the ON state, while the current that is read after applying the erasing voltage represents the OFF state.

EXAMPLE 4

Furthermore, films of Redox-addressable 1,1'-diethyl-4,4' bipyridinium dibromide were prepared by evaporation on ITO substrates. The films have been measured directly with CAFM.

Performing a cyclovoltametry cycle with CAFM in contact mode, a clear bistability could be detected with an ON-OFF ratio of 1.2. FIG. 10 illustrates a current-voltage-(I-V) characteristic of the sample.

EXAMPLE 5

Electric field driven conductivity change materials are classified according to materials exhibiting a charge transfer between components of a charge transfer complex upon application of electric field which results in a conductivity change of the active layer that includes the charge transfer complex and materials exhibiting a charge transfer from the electrode to the molecules in the active layer which results in a conductivity change. Preferably the active layers are aligned which results in a dipole reorientation and favours the charge transfer. The alignment of the active layers is obtained for example with electromagnetic irradiation of the layers.

The process of a conductivity change between components of a charge transfer complex upon application of an electric field is generally shown in FIGS. 11a to 11c. In a low-conductivity state, which can be considered as the "off" state, charge carriers such as electrons occupy the lowest energy levels as is shown in FIG. 11a. Due to an application of an electric field electrons are transferred from a donor molecule to an acceptor molecule as is shown in FIG. 11b. As a result, charge carriers occupy higher energy levels. Thus the material is in a state of high conductivity or "on" state.

According to one embodiment of the present invention, a conjugated matrix is used as the donor and molecules or semiconductor nanoparticles are used as acceptors. As a result, a better conductivity and higher de-localization of the charges are obtained. This leads to a more stable on-state.

FIG. 12 shows a microscopic measurement of the I(V) characteristic of an organic charge transfer complex comprising N,N'-Diphenyl-N,N'-bis(4'-(N,N-bis(naphta-1-yl)-amino)biphenyl-4-yl)benzidine as donor and fullerene C61 (5 wt. %) as acceptor. For the measurement the active material has been directly contacted with a doped diamond cantilever tip.

FIG. 13a shows the current-voltage-I(V)-characteristic of a N,N'-Diphenyl-N,N'-bis(4'-(N,N'-bis(naphta-1-yl)-amino)-biphenyl-4-yl)benzidine sample without acceptor molecules, while in the measurement shown in FIG. 13b 5 wt. % of acceptor molecules. This comparative measurement shows the significant effect of the interaction of the donor and acceptor molecules.

EXAMPLE 6

Samples with aligned layers of active material exhibiting a charge transfer from the electrode to the molecules in the active layer upon application of electric field have also been prepared.

FIG. 14 illustrates a current-voltage-(I-V)-characteristic of a sample comprising an ITO/PEDOT substrate and an oriented active layer of 100 nm of PAP P1 to which a charge transfer from the electrode occurs upon application of an electric field. The P1 molecule is given by the following formula:

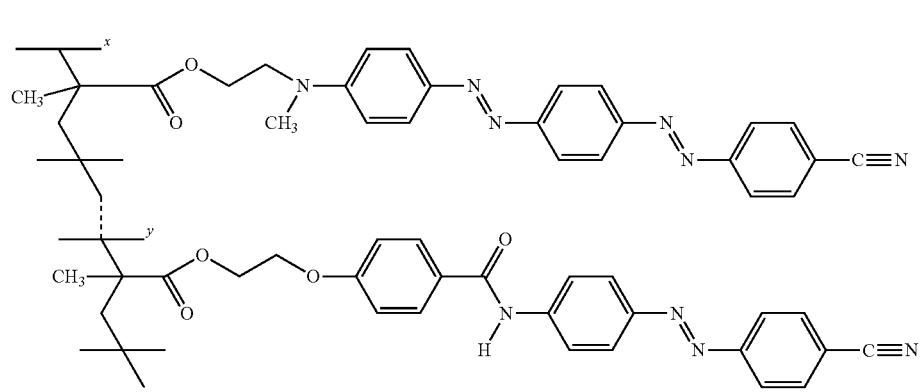

P1

The aligned layers have been prepared by irradiation with electromagnetic radiation of 532 nm. FIG. 15 illustrates an absorption characteristic of the active layer. The sample was a bistable system with an ON/OFF ratio of $5 \cdot 10^2$ at 1 V. The power consumption of switching was about 6 mW for a spot of 5 mm$^2$.

EXAMPLE 7

FIG. 16 illustrates a current-voltage-(I-V)-characteristic of a sample comprising an ITO/PEDOT substrate and an oriented active layer of 100 nm PAP P1 and of 40 nm of annealed PF-co-T in which a charge transfer from the electrode to the molecules in the active layer occurs upon application of an electric field. The P1 layer was irradiated at 532 nm to align it.

A bistable system was achieved comprising as least 7 write-delete cycles. The sample was more stable than a sample comprising a P1 layer alone. At a voltage of 1V an ON/OFF ratio of $3 \cdot 10^3$ was determined for a current density of 200 mA/cm$^2$.

EXAMPLE 8

A group of current driven polarization change materials comprise so called electrets. Electrets are isolating dielectric materials which sustain a "quasi"-permanent external electrical field when polarized by uncompensated monopolar charges (e.g. space-charge electrets) or aligned dipole charges (e.g. ferroelectrets).

FIG. 17 shows a scheme of a sample including a metal electrode 3 and an electret 5 as an active layer. As shown in the figure, the dipolar charges of electret comprise a parallel orientation due to the application of an electric current. In the metal electrode compensating charges accumulate at the interface with the electret.

The material exhibiting a change of polarization can also be a multi-layer system with layers of different functionality such as a supporting layer for decreasing the roughness of the active layer or layers of varying conductivity for electrons and holes to block charges from leaking out to the electrode.

COC (cyclic olefin copolymers), PC (polycarbonate), PS (polystyrene) and PMMA (polymethyl meta crylat) have been used in thin films as polymer electrets. In the samples the charge spot size and its signal strength are mainly determined by the applied voltage pulse height and duration. The sample is a flat substrate (e.g. glass slice) covered with an electrode (e.g. platinum, gold, aluminum film) onto which a thin (less than 100 nm thick) polymer electret film is spin-cast from the solution.

FIG. 18 shows an EFM phase change image of charge spots written with 5 V tip bias for 1 s in contact to a 20 nm spin cast PMMA film on a platinum electrode. Nine spots (white) have been erased by a voltage pulse of −5 V tip bias. The oscillation of the cantilever in the EFM mode is driven at its resonance frequency, and the amplitude of the oscillation in the non-contact mode is adjusted to maximize the phase change signal without touching the sample surface.

FIG. 19 shows an EFM phase change image of charge spots written with 30 V tip bias pulses and varying pulse widths in contact to a 60 nm PMMA film spin cast on a Pt electrode.

The spot size and signal strength depend strongly on the pulse width with detectable spots for pulse width as short as 500 ns.

In 30 nm thick spin cast COC films, charge spots as small as 30 nm using a highly doped silicon, high aspect ratio tip from NanoSensors (AR5-NCHR, 42 N/m, 320 kHz, t$_r$<10 nm, aspect ratio 5:1, 5° half cone, 12 μm tip, 0.02 Ohm cm) for spot writing in contact mode and EFM read out have been achieved. As can be seen in the EFM phase change image in FIG. 20, the spot size is strongly dependent on the write pulse voltage, with an onset at ~12 V.

In the EFM phase change image shown in FIG. 21, the charge spots have been written in a 14 nm thick polycarbonate (PC) film on a PEDOT:PSS film on a Pt electrode with 30 V tip bias pulses and varying pulse widths (500 ns, 50 μs, 5 ms, 500 ms, 5 s) for the different three rows.

The charge storing characteristics of the material like the signal strength and the charge retention time can also be tuned by blending the polymer electret with metal or semiconductor nanoparticles or electron donor and acceptor molecules. Increased charging of COC films blended with 1 wt % of dodecanethiol-protected gold nanoparticles have been observed. In differentiation to the electrically conductive charge-storing elements embedded in the surface on an insulator as described in US2006 7102982, the gold nanoparticles described here are smaller and homogeneously distributed throughout the volume of the insulator film.

One important aspect to consider for a storage medium is the time and temperature stability of the written bit pattern. Charge stored in electret films typically decays first exponentially and than linearly, and much faster for increased temperatures. For polymer electret films, retention times up to many years have been reported. In our experiments, we observe a broadening and decay in strength of the written charge spots within some weeks.

EXAMPLE 11

Regarding electric field driven polarization change materials good isolating polymer materials with electron donors and acceptors have been blended for charge transfer as in examples 5 to 7, but instead of optimizing it for current read out, it is optimized for strong dipole fields.

For a thin film of ST 1163 blended with 5 wt % fullerene C61 a EFM phase change signal of 0.4° has been achieved on an area previously polarized by scanning the area in contact with a probe at −8 V bias. An EFM image of the sample is shown in FIGS. 22*a* and 22*b*. The EFM images were taken with the tip at a distance of 70 nm from the surface.

The invention claimed is:

1. A memory device, comprising:
   a storage material,
   a first electrode connected to the storage material, and
   a second electrode associated to the storage material,
   wherein the storage material is (A), (B), (C), (D), (E), (F), (G), (H), (I), (J), (K) or (L):
   (A) a material exhibiting a change of conductivity upon application of an electric current, comprising an electron poor molecule having a formula selected from the group consisting of (A1) and (A2):

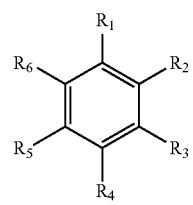

(A1)

wherein
R, $R_1$, $R_2$, $R_3$, $R_4$, $R_5$ and $R_6$ are each independently selected from the group consisting of C=O, COOH, F, Cl, Br, I, CN, $NO_2$, $NR_3^+$, O—Ar, COOR, OR, COR, SH, SR, $CONH_2$, CONHR, $CONR_2$, CHO, OH, $SO_2R$, $SO_2OR$, NO, C=CR, and Ar;

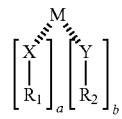

(A2)

wherein
M is a transition metal,
X and Y are each independently an electron withdrawing group selected from the group consisting of C=O, COOH, F, Cl, Br, I, CN, $NO_2$, $NR_3^+$, N=C, O—Ar, COOR, OR, COR, SH, SR, $CONH_2$, CONHR, $CONR_2$, CHO, C=N, OH, $SO_2R$, $SO_2OR$, NO, C=CR, and Ar, $R_1$ and $R_2$ are each independently aromatic or allilylic, and
a and b are integers;
   (B) a material exhibiting a change of conductivity upon application of an electric current comprising an electron poor molecule having a formula selected from the group consisting of (B1), (B2), (B3), (B4), (B5) and (B6):

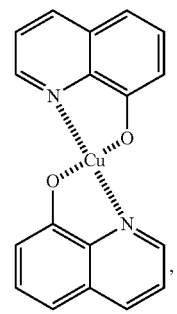

(B1)

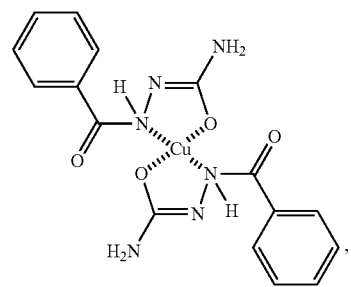

(B2)

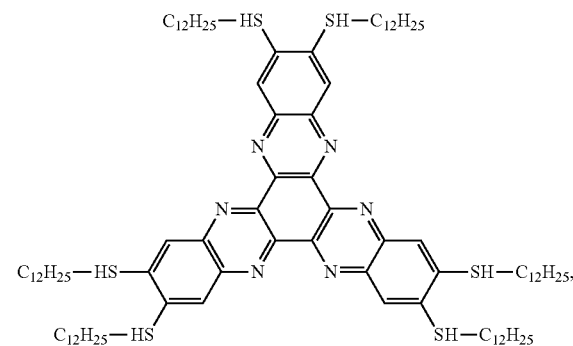

(B3)

(B4)

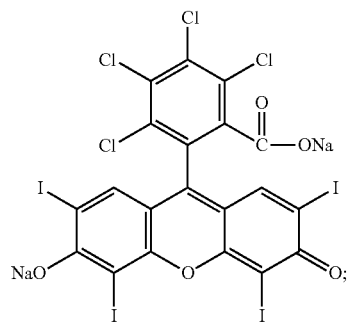

(B5)

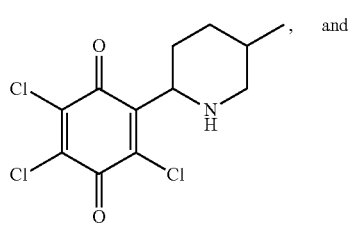
and (B6)

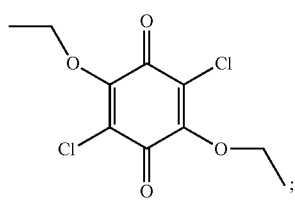

(C) a material exhibiting a change of conductivity upon application of an electric current, comprising a Redox-addressable molecule having a formula of (C1):

(C1)

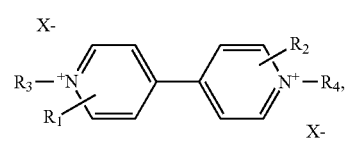

wherein $R_1$, $R_2$, $R_3$ and $R_4$ are each independently aryl or alkyl, and $X^-$ is an anion;

(D) a material exhibiting a change of conductivity upon application of an electric current, comprising a Redox-addressable molecule having a formula selected from the group consisting of (D1), (D2), (D3), (D4), (D5), (D6), (D7), (D8) and (D9):

(D1)

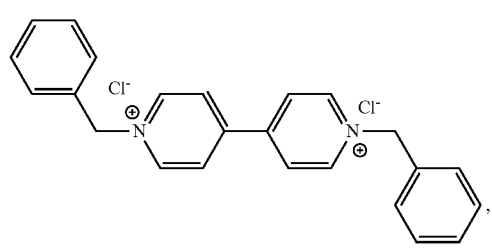

(D2)

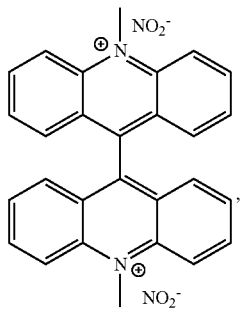

(D3)

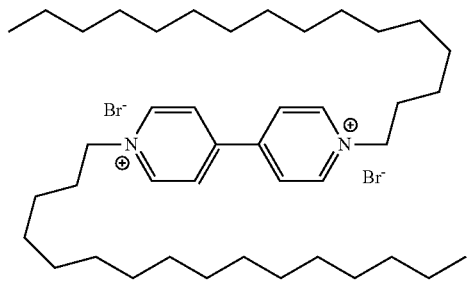

(D4)

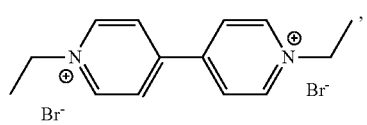

(D5)

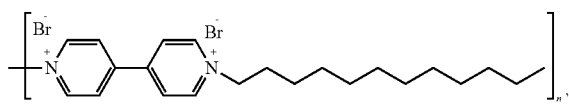

(D6)

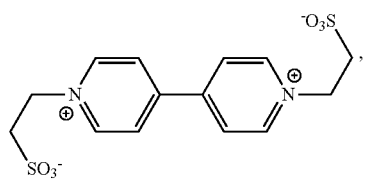

(D7)

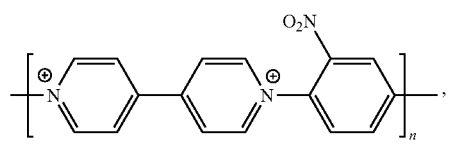

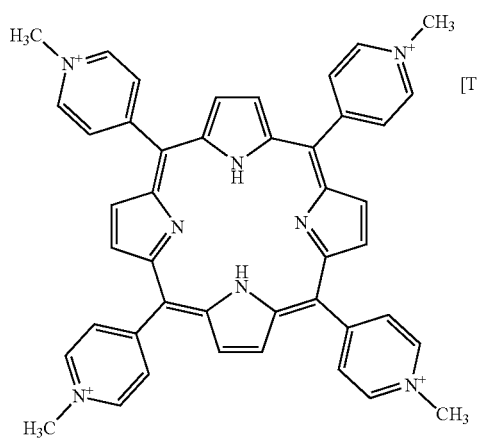
[TsO⁻]₄, and
(D8)
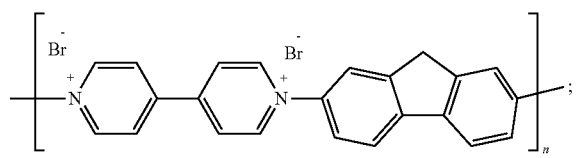
(D9)
(E) a material comprising a component that undergoes a charge transfer in response to an application of an electric field or undergoes a charge transfer with a connected electrode in response to an application of an electric field, and comprising an electron donor molecule having a formula selected from the group consisting of (E1), (E2) and (E3):
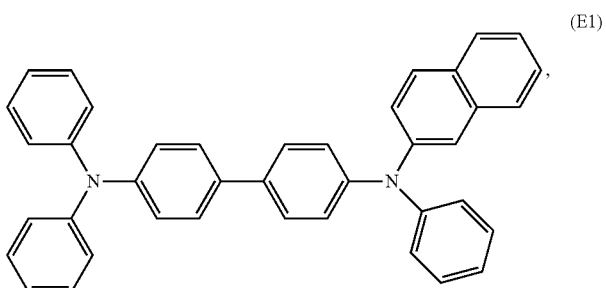
(E1)
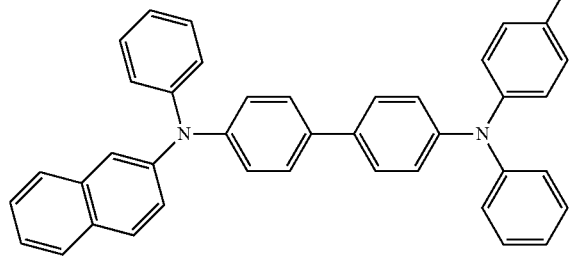
(E2)
and
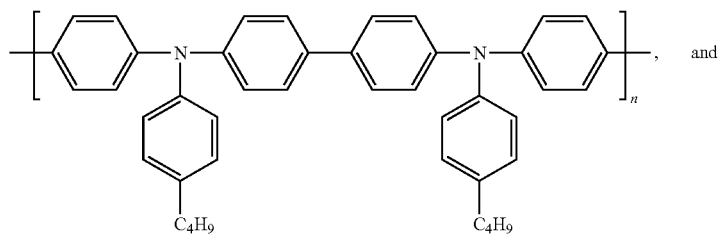
(E3)
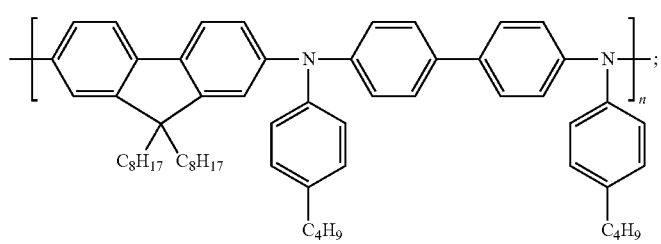

(F) a material comprising a component that undergoes a charge transfer in response to an application of an electric field or undergoes a charge transfer with a connected electrode in response to an application of an electric field, and comprises an electron acceptor molecule selected from the group consisting of C60 fullerene, C61 fullerene, a fullerene derivative, a semiconductor nanodot, an electron poor transition metal complex, CdSe and platinum octaethyl porphine;

(G) a material comprising a component that undergoes a charge transfer in response to an application of an electric field or undergoes a charge transfer with a connected electrode in response to an application of an electric field, and comprises a molecule having a formula selected from the group consisting of (G1) and (G2):

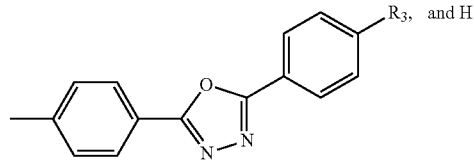

R1 and R2 are each independently selected from the group consisting of a straight chain $C_{1-20}$ alkyl, a branched $C_{1-20}$ alkyl, an aryl, a substituted aryl, an alkylaryl, a substituted alkylaryl, an alkoxyaryl, a substituted alkoxyaryl, an ary-

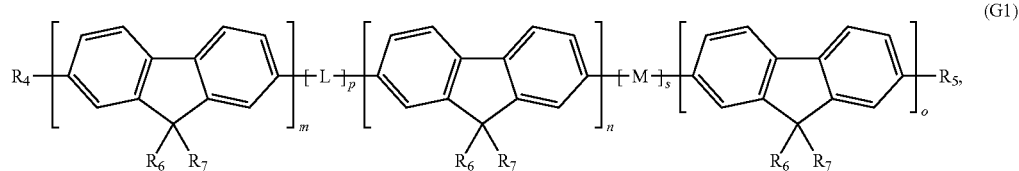

wherein

R4 and R5 are each independently selected from the group consisting of:

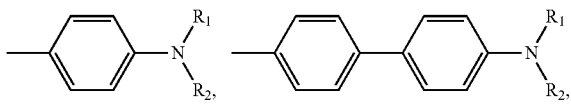

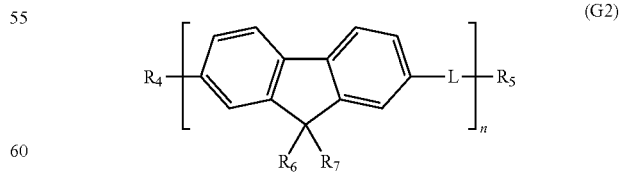

loxyaryl, a substituted aryloxyaryl, a dialkylaminoaryl, a substituted dialkylaminoaryl, a diarylaminoaryl and a substituted diarylaminoaryl, R3 is selected from the group consisting of a straight chain $C_{1-20}$ alkyl, a branched $C_{1-20}$ alkyl, an aryl, a substituted aryl, an alkylaryl and a substituted alkylaryl, and R6 and R7 are independently at each occurrence selected from the group consisting of a straight chain $C_{1-20}$ alkyl, a branched chain $C_{1-20}$ alkyl, an aryl, a substituted aryl, an alkylaryl, a substituted alkylaryl, and —$(CH_2)_q$—(O—$CH_2$—$CH_2)_r$—O—$CH_3$, q is greater than or equal to 1, and less than or equal to 10, r is greater than or equal to 0, and less than or equal to 20, L and M are independently at each occurrence selected from the group consisting of thiophene, a substituted thiophene, phenyl, a substituted phenyl, phenanthrene, a substituted phenanthrene, anthracene, a substituted anthracene, an aromatic monomer that can be synthesized as a dibromo-substituted monomer, benzothiadiazole, a substituted benzothiadiazole, perylene and a substituted perylene, a sum of m, n and o is less than 10, and each of m, n and o is independently selected from a range of 1 to 1,000, p is in a range of 0 to 15, and wherein s is in a range of 0 to 15, with the proviso that, if R4 is H, R5 is not H, and if R5 is H, R4 is not H, wherein L, $R_4$, $R_5$, $R_6$ and $R_7$ are defined as for (G1);

(H) a material comprising a component that undergoes a charge transfer in response to an application of an electric field or undergoes a charge transfer with a connected electrode in response to an application of an electric field, and comprises a molecule having a formula selected from the group consisting of (H1), (H2), (H3), (H4), (H5) and (H6):

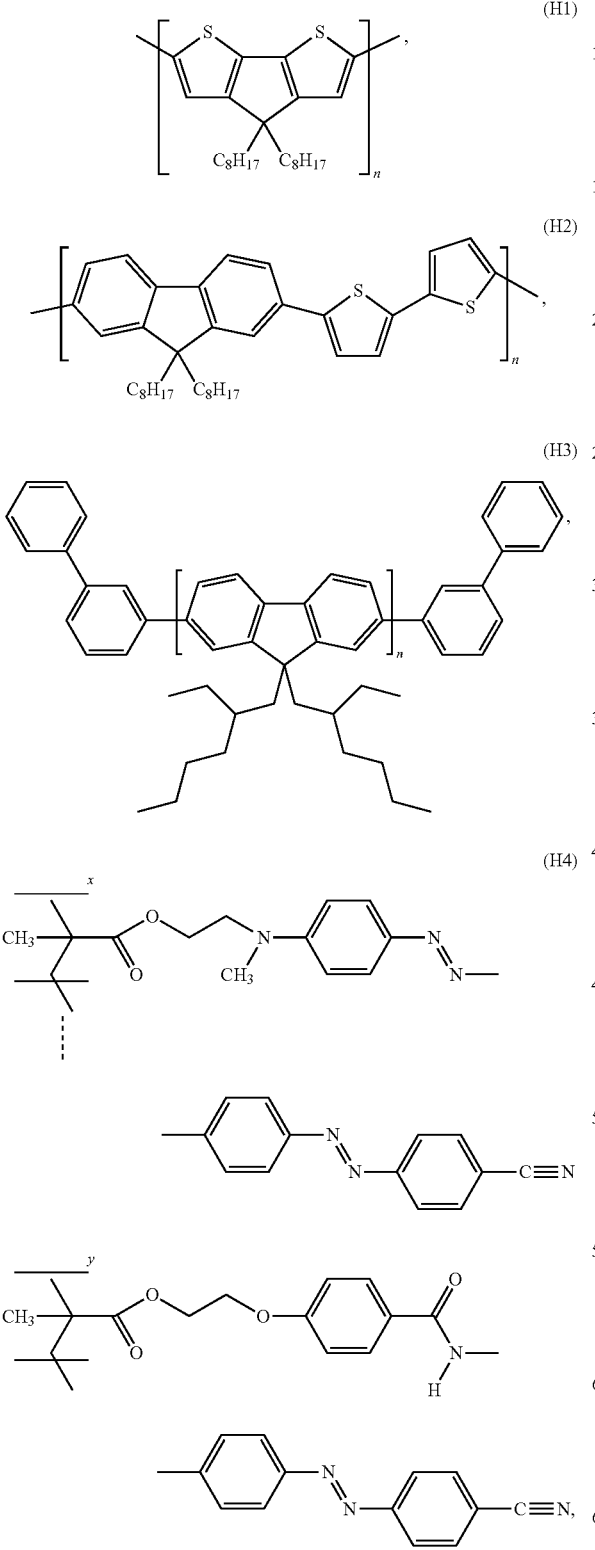

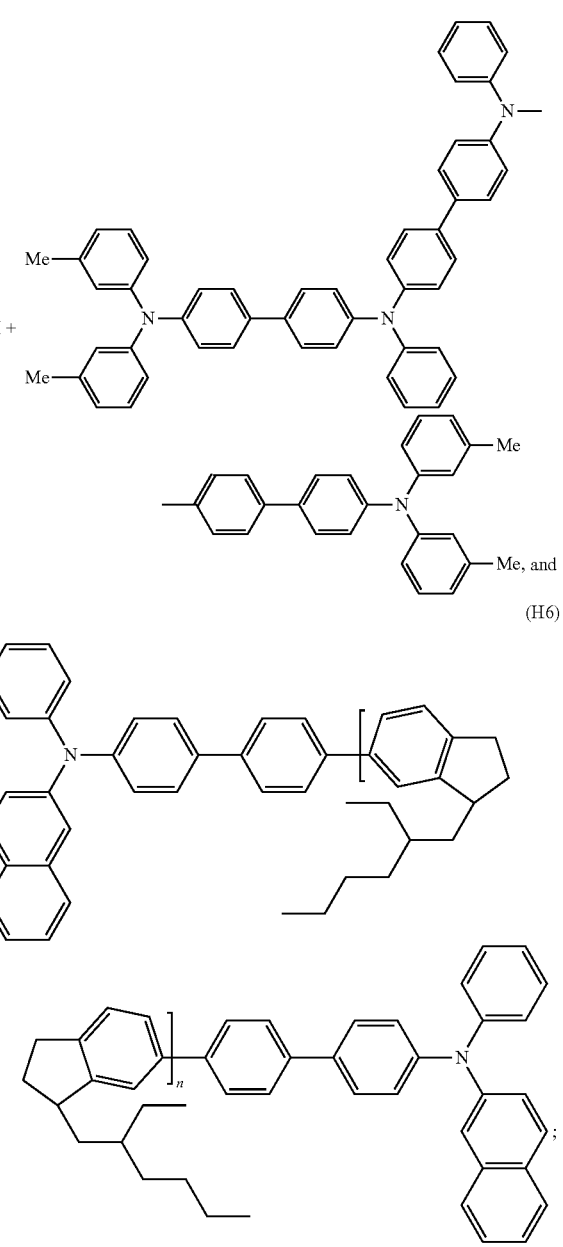

(I) a material exhibiting a change of polarization upon application of an electrical current, comprising at least one selected from the group consisting of a fluoropolymer, a cycloolefin, a polyamide, a polyimide, a polyester, polystyrene, polymethyl methacrylate, polypropylene, polysulfone, polyethylene, polyvinyl chloride and polyurethane;

(J) a material exhibiting a change of polarization upon application of an electrical current, which is an isolating dielectric material sustaining a quasi-permanent external electric field when polarized by uncompensated monopolar charges or aligned polar charges;

(K) a material exhibiting a change of polarization upon application of an electrical current, which is one selected from the group consisting of a blend of an organic electret with an acceptor or donor molecule, a blend of an isolating dielectric material with a dipole molecule or dipole complex and a molecule with an intra-molecular dipole;

(L) a material exhibiting a change of polarization upon application of an electric field, which is N,N'-Diphenyl-N,N'-bis(4'-(N,N-bis(naphtha-1-yl)-amino)-biphenyl-4-yl)benzidine with 5 wt % of fullerene C61.

2. The memory device of claim 1, further comprising a probe that is movable across the storage material and that forms the second electrode.

3. The memory device of claim 1, wherein the second electrode is fixed to the storage material.

4. The memory device of claim 1, further comprising at least one of an interface layer arranged between the first electrode and the storage material and an interface layer arranged on top of the storage material.

5. The memory device of claim 1, further comprising a means adjusted to apply a voltage pulse to the storage material to store and erase information in the storage material.

6. The memory device of claim 1, further comprising a means to read information stored in the storage material which is adapted to apply and measure an electric current flowing through the storage material or adapted to measure an electric field of said storage material.

7. The memory device of claim 1, wherein the storage material is (A).

8. The memory device of claim 1, wherein the storage material is (B).

9. The memory device of claim 1, wherein the storage material is (C).

10. The memory device of claim 1, wherein the storage material is (D).

11. The memory device of claim 1, wherein the storage material comprises at least one donor group selected from the group consisting of: $O^-$, $S^-$, $NR_2$, $NAr_2$, NRH, $NH_2$, NHCOR, OR, OH, OCOR, SR, SH, Br, I, Cl, F, R, and Ar.

12. The memory device of claim 1, wherein the storage material is (E).

13. The memory device of claim 1, wherein the storage material comprises at least one acceptor group selected from the group consisting of: $NO_2$, CN, COOH, COOR, $CONH_2$, CONHR, $CONR_2$, CHO, COR, $SO_2R$, $SO_2OR$, NO, and Ar.

14. The memory device of claim 1, wherein the storage material is (F).

15. The memory device of claim 1, wherein the storage material is (G).

16. The memory device of claim 1, wherein the storage material is (H).

17. The memory device of claim 1, wherein the storage material is (I).

18. The memory device of claim 1, wherein the storage material is (J).

19. The memory device of claim 1, wherein the storage material is (K).

20. The memory device of claim 1, wherein the storage material is (L).

21. A method of manufacturing the memory device of claim 1, comprising:
depositing the storage material on the first electrode; and
providing the second electrode associated to the storage material.

22. The method of claim 21, further comprising arranging a probe over the storage material, wherein the probe is movable across a surface of the storage material.

23. The method of claim 21, further comprising depositing a fixed electrode on top of the storage material.

24. The method of claim 21, further comprising arranging at least one of an interface layer between the first electrode and the storage material and an interface layer on top of the storage material.

25. The method of claim 21, further comprising providing a means that is adjusted to apply a voltage pulse to the storage material to store and erase information in the storage material.

26. The method of claim 21, further comprising providing a means to read information stored in the storage material which is adapted to apply and measure an electric current flowing through the storage material or adapted to measure an electric field of said storage material.

27. The method of claim 21, wherein the storage material is (A).

28. The method of claim 21, wherein the storage material is (B).

29. The method of claim 21, wherein the storage material is (C).

30. The method of claim 21, wherein the storage material is (D).

31. The method of claim 21, wherein the storage material comprises at least one donor group selected from the group consisting of: $O^-$, $S^-$, $NR_2$, $NAr_2$, NRH, $NH_2$, NHCOR, OR, OH, OCOR, SR, SH, Br, I, Cl, F, R, and Ar.

32. The method of claim 21, wherein the storage material is (E).

33. The method of claim 21, wherein the storage material comprises at least one acceptor group selected from the group consisting of: $NO_2$, CN, COOH, COOR, $CONH_2$, CONHR, $CONR_2$, CHO, COR, $SO_2R$, $SO_2OR$, NO, and Ar.

34. The method of claim 21, wherein the storage material is (F).

35. The method of claim 21, wherein the storage material is (G).

36. The method of claim 21, wherein the storage material is (H).

37. The method of claim 21, wherein the storage material is (I).

38. The method of claim 21, wherein the storage material is (J).

39. The method of claim 21, wherein the storage material is (K).

40. The method of claim 21, wherein the storage material is (L).

* * * * *